(12) United States Patent  (10) Patent No.: US 8,868,821 B2
Steiner et al.  (45) Date of Patent: Oct. 21, 2014

(54) SYSTEMS AND METHODS FOR PRE-EQUALIZATION AND CODE DESIGN FOR A FLASH MEMORY

(75) Inventors: Avi Steiner, Kiryat Motzkin (IL); Hanan Weingarten, Herzelia (IL)

(73) Assignee: Densbits Technologies Ltd., Haifa (IL)

( * ) Notice: Subject to any disclaimer, the term of this patent is extended or adjusted under 35 U.S.C. 154(b) by 860 days.

(21) Appl. No.: 12/836,948

(22) Filed: Jul. 15, 2010

(65) Prior Publication Data

US 2011/0055461 A1  Mar. 3, 2011

Related U.S. Application Data

(60) Provisional application No. 61/237,336, filed on Aug. 27, 2009, provisional application No. 61/236,911, filed on Aug. 26, 2009.

(51) Int. Cl.
   *G06F 12/00* (2006.01)
   *G11C 11/56* (2006.01)
   *G06F 11/10* (2006.01)

(52) U.S. Cl.
   CPC ........ *G06F 11/1072* (2013.01); *G11C 11/5628* (2013.01)
   USPC ................... 711/103; 711/156; 711/E12.008; 714/704

(58) Field of Classification Search
   None
   See application file for complete search history.

(56) References Cited

U.S. PATENT DOCUMENTS

| | | | |
|---|---|---|---|
| 4,463,375 A | 7/1984 | Macovski | |
| 4,584,686 A | 4/1986 | Fritze | |
| 4,589,084 A | 5/1986 | Fling et al. | |
| 4,866,716 A | 9/1989 | Weng | |
| 5,077,737 A | 12/1991 | Leger et al. | |
| 5,297,153 A | 3/1994 | Baggen et al. | |
| 5,657,332 A | 8/1997 | Auclair et al. | |
| 5,729,490 A | 3/1998 | Calligaro et al. | |
| 5,793,774 A | 8/1998 | Usui et al. | |
| 5,926,409 A | 7/1999 | Engh et al. | |
| 5,956,268 A | 9/1999 | Lee | |
| 5,982,659 A | 11/1999 | Irrinki et al. | |
| 6,038,634 A | 3/2000 | Ji et al. | |
| 6,094,465 A | 7/2000 | Stein et al. | |
| 6,119,245 A | 9/2000 | Hiratsuka | |
| 6,182,261 B1 | 1/2001 | Haller et al. | |

(Continued)

OTHER PUBLICATIONS

Search Report of PCT Patent Application WO 2009/118720 A3.

(Continued)

*Primary Examiner* — Christian P Chace
*Assistant Examiner* — Eric Loonan
(74) *Attorney, Agent, or Firm* — Dentons US LLP

(57) ABSTRACT

A system, computer readable program, and method for programming flash memory, the method includes: providing multiple pairs of most significant bit (MSB) page uncoded bit error rates (UBERs) and least significant bit (LSB) page UBERs; selecting a selected MSB page code rate and a selected LSB page code rate so that a selected MSB page UBER associated with the selected MSB page code rate and a selected LSB page UBER associated with the selected LSB page code rate support a highest average UBER out of the multiple pairs of MSB page UBERs and LSB page UBERs, wherein the selected MSB page code rate and the selected LSB page code rate are obtainable under a desired code rate constraint; and determining an encoding and programming scheme that may be based on the selected MSB page UBER, the selected MSB code rate, the selected LSB page UBER and the selected LSB code rate.

67 Claims, 12 Drawing Sheets

(56) References Cited

U.S. PATENT DOCUMENTS

| | | |
|---|---|---|
| 6,192,497 B1 | 2/2001 | Yang et al. |
| 6,195,287 B1 | 2/2001 | Hirano |
| 6,199,188 B1 | 3/2001 | Shen et al. |
| 6,209,114 B1 | 3/2001 | Wolf et al. |
| 6,259,627 B1 | 7/2001 | Wong |
| 6,278,633 B1 | 8/2001 | Wong et al. |
| 6,279,133 B1 | 8/2001 | Vafai et al. |
| 6,301,151 B1 | 10/2001 | Engh et al. |
| 6,370,061 B1 | 4/2002 | Yachareni et al. |
| 6,374,383 B1 | 4/2002 | Weng |
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,290,203 B2 | 10/2007 | Emma et al. |
| 7,292,365 B2 | 11/2007 | Knox et al. |
| 7,301,928 B2 | 11/2007 | Nakabayashi et al. |
| 7,441,067 B2 | 10/2008 | Gorobets et al. |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,697,326 B2 | 4/2010 | Sommer et al. |
| 7,706,182 B2 | 4/2010 | Shalvi et al. |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,961,797 B1 | 6/2011 | Yang et al. |
| 8,020,073 B2 | 9/2011 | Emma et al. |
| 8,122,328 B2 | 2/2012 | Liu et al. |
| 8,327,246 B2 * | 12/2012 | Weingarten et al. .......... 714/790 |
| 2002/0063774 A1 | 5/2002 | Hillis et al. |
| 2002/0085419 A1 | 7/2002 | Kwon et al. |
| 2002/0154769 A1 | 10/2002 | Petersen et al. |
| 2003/0065876 A1 | 4/2003 | Lasser |
| 2003/0101404 A1 | 5/2003 | Zhao et al. |
| 2003/0105620 A1 | 6/2003 | Bowen |
| 2003/0192007 A1 | 10/2003 | Miller et al. |
| 2004/0015771 A1 | 1/2004 | Lasser et al. |
| 2004/0030971 A1 | 2/2004 | Tanaka et al. |
| 2004/0153722 A1 | 8/2004 | Lee |
| 2004/0153817 A1 | 8/2004 | Norman et al. |
| 2004/0181735 A1 | 9/2004 | Xin |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le Bars et al. |
| 2005/0144213 A1 | 6/2005 | Simkins et al. |
| 2005/0144368 A1 | 6/2005 | Chung et al. |
| 2005/0169057 A1 | 8/2005 | Shibata et al. |
| 2005/0172179 A1 | 8/2005 | Brandenberger et al. |
| 2005/0213393 A1 | 9/2005 | Lasser |
| 2006/0059406 A1 | 3/2006 | Micheloni et al. |
| 2006/0059409 A1 | 3/2006 | Lee |
| 2006/0064537 A1 | 3/2006 | Oshima |
| 2006/0101193 A1 | 5/2006 | Murin |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata et al. |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2008/0010581 A1 | 1/2008 | Alrod et al. |
| 2008/0028014 A1 | 1/2008 | Hilt et al. |
| 2008/0055989 A1 | 3/2008 | Lee et al. |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0116509 A1 | 5/2008 | Harari et al. |
| 2008/0126686 A1 | 5/2008 | Sokolov et al. |
| 2008/0127104 A1 | 5/2008 | Li et al. |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0148115 A1 | 6/2008 | Sokolov et al. |
| 2008/0158958 A1 | 7/2008 | Shalvi et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0219050 A1 | 9/2008 | Shalvi et al. |
| 2008/0225599 A1 | 9/2008 | Chae |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0043951 A1 | 2/2009 | Shalvi et al. |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn et al. |
| 2009/0144600 A1 | 6/2009 | Perlmutter et al. |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |

(56) References Cited

U.S. PATENT DOCUMENTS

| | | |
|---|---|---|
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2010/0005270 A1 | 1/2010 | Jiang |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0293321 A1 | 11/2010 | Weingarten |
| 2011/0051521 A1 | 3/2011 | Levy et al. |
| 2011/0055461 A1 | 3/2011 | Steiner et al. |
| 2011/0096612 A1 | 4/2011 | Steiner et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1 | 1/2012 | Katz et al. |
| 2012/0051144 A1 | 3/2012 | Weingarten et al. |
| 2012/0063227 A1 | 3/2012 | Weingarten et al. |
| 2012/0066441 A1 | 3/2012 | Weingarten |
| 2012/0110250 A1 | 5/2012 | Sabbag et al. |

OTHER PUBLICATIONS

Search Report of PCT Patent Application WO 2009/095902 A3.
Search Report of PCT Patent Application WO 2009/078006 A3.
Search Report of PCT Patent Application WO 2009/074979 A3.
Search Report of PCT Patent Application WO 2009/074978 A3.
Search Report of PCT Patent Application WO 2009/072105 A3.
Search Report of PCT Patent Application WO 2009/072104 A3.
Search Report of PCT Patent Application WO 2009/072103 A3.
Search Report of PCT Patent Application WO 2009/072102 A3.
Search Report of PCT Patent Application WO 2009/072101 A3.
Search Report of PCT Patent Application WO 2009/072100 A3.
Search Report of PCT Patent Application WO 2009/053963 A3.
Search Report of PCT Patent Application WO 2009/053962 A3.
Search Report of PCT Patent Application WO 2009/053961 A3.
Search Report of PCT Patent Application WO 2009/037697 A3.
Yani Chen, Kcshab K. Parhi, "Small Area Parallel Chien Search Architectures for Long BCH Codes", Ieee Transactions o Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. II-369-II-372 vol. 2.
David Esseni, Bruno Ricco, "Trading-Off Programming Speed and Current Absorption in Flash Memories with the Ramped-Gate Programming Technique", Ieee Transactions on Electron Devices, vol. 47, No. 4, Apr. 2000.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.
JEDEC Standard Stress-Test-Driven Qualification of Integrated Circuits JEDEC Solid State Technology Association. JEDEC Standard No. 47F pp. 1-26 Dec. 2007.
Dempster et al. Maximum Likelihood from Incomplete Data via the EM Algorithm Journal of the Royal Statistical Society. Series B (Methodological), vol. 39, No. 1. (1977), pp. 1-38.

* cited by examiner

US 8,868,821 B2

SYSTEMS AND METHODS FOR PRE-EQUALIZATION AND CODE DESIGN FOR A FLASH MEMORY

CLAIM OF PRIORITY

This application claims the benefit of priority, under 35 U.S.C. §119, of U.S. Provisional Patent Application No. 61/237,336, filed Aug. 27, 2009, and titled "Systems and Methods For Pre-equalization and Code Design For a Flash Memory" and U.S. Provisional Patent Application No. 61/236,911, entitled "A System and a Method of High Reliability Flash", filed Aug. 26, 2009, the contents of which are hereby incorporated by reference in their entirety.

TECHNICAL FIELD

The present invention relates to systems and method for programming flash memory units.

BACKGROUND

In a multi-level Flash memory unit the pages can be separated by n-levels, corresponding to log 2(n) number of bits stored per cell.

FIG. 1 demonstrates eight equally spaced lobes 11-18 that represent eight logic levels per cell. These lobes represent a desired voltage level distribution of 3 bits-per-cell (bpc) flash memory page.

FIG. 1 also illustrates a most significant bit (MSB) read threshold 25, two center significant bit (CSB) read thresholds 23 and 27 and four least significant bit (LSB) read thresholds 22, 24, 26 and 28.

To read an MSB page, a single threshold comparison can be performed (with MSB read threshold 25). To read a CSB page, two read thresholds can be used (CSB read thresholds 23 and 27) to determine the bit value of every CSB associated cell. For LSB pages the bit-values may be determined by using the four LSB read thresholds 22, 24, 26 and 28.

In FIG. 1 the voltage level distributions per level (represented by the lobes) are non-overlapping, however this is only schematic, and in practical cases the distributions may overlap.

Overlapping may be programmed to obtain high programming speed, or can be due to the retention effect. For floating gate devices, an "old" page, may introduce greater overlap between lobes than a new page, since after many program/erase (P/E) cycles there may be an accumulated trap charge, which can be de-trapped over time. After a long duration, every lobe may have a larger standard deviation and may have a different mean location. These are just two examples for overlapping distributions. There may be many more, such as read disturbs, programming disturbs, etc.

The overlap of the lobes distribution induces page read errors. The greater the overlap, the higher can be the error probability. For a Gaussian distribution per lobe, the probability of error for a specific lobe, may be given by using the complementary error function, $$P_e(n, x_{th}) = \frac{1}{2} erfc\left(\frac{|x_{th} - \mu_n|}{\sigma}\right)$$

$\sigma$—$n^{th}$ lobe std
$\mu_n$—$n^{th}$ lobe mean voltage
n—lobe index (0, . . . , 7 for 3 bpc)

where erfc is the conventional complementary error function $$erfc(z) = \frac{1}{\sqrt{2\pi}} \int_z^\infty e^{-t^2/2} dt$$

The error probability around a certain read threshold may be the sum of error probabilities for two neighboring lobes. For the example of 3-bits-per-cell (where there are 8 lobes), the single threshold error probability can be given by $$P_{e,TH}(n, x_{th}) = \frac{1}{8}(P_e(n, x_{th}) + P_e(n+1, x_{th}))$$

For the different page types (MSB, CSB, LSB), the error probability depends on the number of read thresholds. For low error probabilities, the bit-type bit error rate for 3 bpc can be approximated as depicted by FIG. 2, $P_{e,MSB} = P_{e,TH}(3, x_{th,3})$ $P_{e,CSB} = P_{e,TH}(1, x_{th,1}) + P_{e,TH}(5, x_{th,5})$ $P_{e,LSB} = P_{e,TH}(0, x_{th,0}) + P_{e,TH}(2, x_{th,2}) + P_{e,TH}(4, x_{th,4}) + P_{e,TH}(6, x_{th,6})$ In a multi-level Flash memory unit the pages may be separated by n-levels, corresponding to $\log_2(n)$ number of bits stored per cell.

FIG. 2 depicts eight equally spaced lobes 31-38 that represent eight logic levels per cell. These lobes overlap (in contrary to non-overlapping lobes 11-18 of FIG. 1) and represent a voltage level distribution of 3 bits per cell flash memory page. FIG. 2 also illustrates MSB read threshold 45, two CSB read thresholds 43 and 47, and four LSB read thresholds 42, 44, 46 and 48.

Error probability can change as a function of lobe spacing, and read thresholds location. In prior-art applications, the lobe spacing can be usually designed to be equal, such that the same probability of error may be obtained for every read threshold. Denote the probability of error per read threshold as $p_e$. Then, the bit-error probability of MSB pages may be $P_{e,MSB} = p_e$, for CSB can be approximately $P_{e,CSB} = 2p_e$, and the LSB can be approximately $P_{e,LSB} = 4p_e$.

SUMMARY OF THE INVENTION

In one aspect, the invention may provide a method for programming a flash memory having flash memory cells capable of storing multiple bits. The method can include providing multiple groups of UBERs, wherein each group may comprise UBERs for a plurality of page types and each page type may be associated with a different bit of the multiple bits. The method may select a group of code rates out of multiple groups of code rates, wherein each group of code rates can comprise code rates for the plurality of page types, the selected group of code rates may be associated with a group of UBERs that has a highest average UBER out of the multiple groups of UBERs, and each UBER of the selected group may be obtained under a desired code rate constraint. The method also may include determining an encoding and programming scheme based on the selected group of UBERs, wherein the providing step can include providing multiple groups of page types and their associated UBER pairs of most significant bit (MSB) page UBERs and least significant bit (LSB) page UBERs. The selecting step may include selecting a selected MSB page code rate and a selected LSB page code rate so that a selected MSB page UBER associated with the selected MSB page code rate and a selected LSB page UBER associated with the selected LSB page code rate may support a highest average UBER out of the multiple pairs of MSB page UBERs and LSB page UBERs, wherein the selected MSB page code rate and the selected LSB page code rate are obtainable under a desired code rate constraint. The determining step may include determining an encoding and programming scheme that may be based on the selected MSB page UBER, the selected MSB code rate, the selected LSB page UBER and the selected LSB code rate.

In another aspect, the invention may provide a system for programming a flash memory. The system may include a flash memory unit having memory cells capable of storing multiple bits, an uncoded bit error rate generator unit configured to provide multiple groups of UBERs, wherein each group may comprise UBERs for a plurality of page types, and each page type may be associated with a different bit of the multiple bits, a selector unit configured to select a selected group of code rates out of multiple groups of code rates, wherein each group of code rates may comprise code rates for the plurality of page types, wherein the selected group of code rates may be associated with a group of UBERs that has a highest average UBER out of the multiple groups of UBERs, wherein each UBER of the selected group may be obtainable under a desired code rate constraint, and a programming scheme determination module configured to determine an encoding and programming scheme that may be based on the selected group of UBERs. The system further can include an encoder unit configured to encode information and store the encoded information in each page type by applying encoding and programming operations that can be responsive to a selected UBER of that page type and a selected code rate of that page type.

Some embodiments of the present invention may achieve improved, optimal, or near-optimal, joint programming pre-equalization and code rate assignment per page type by the disclosed processes by using a configurable error correction coding scheme having rates corresponding to the optimal working point, which supports highest average UBER.

DETAILED DESCRIPTION

Figure 1:
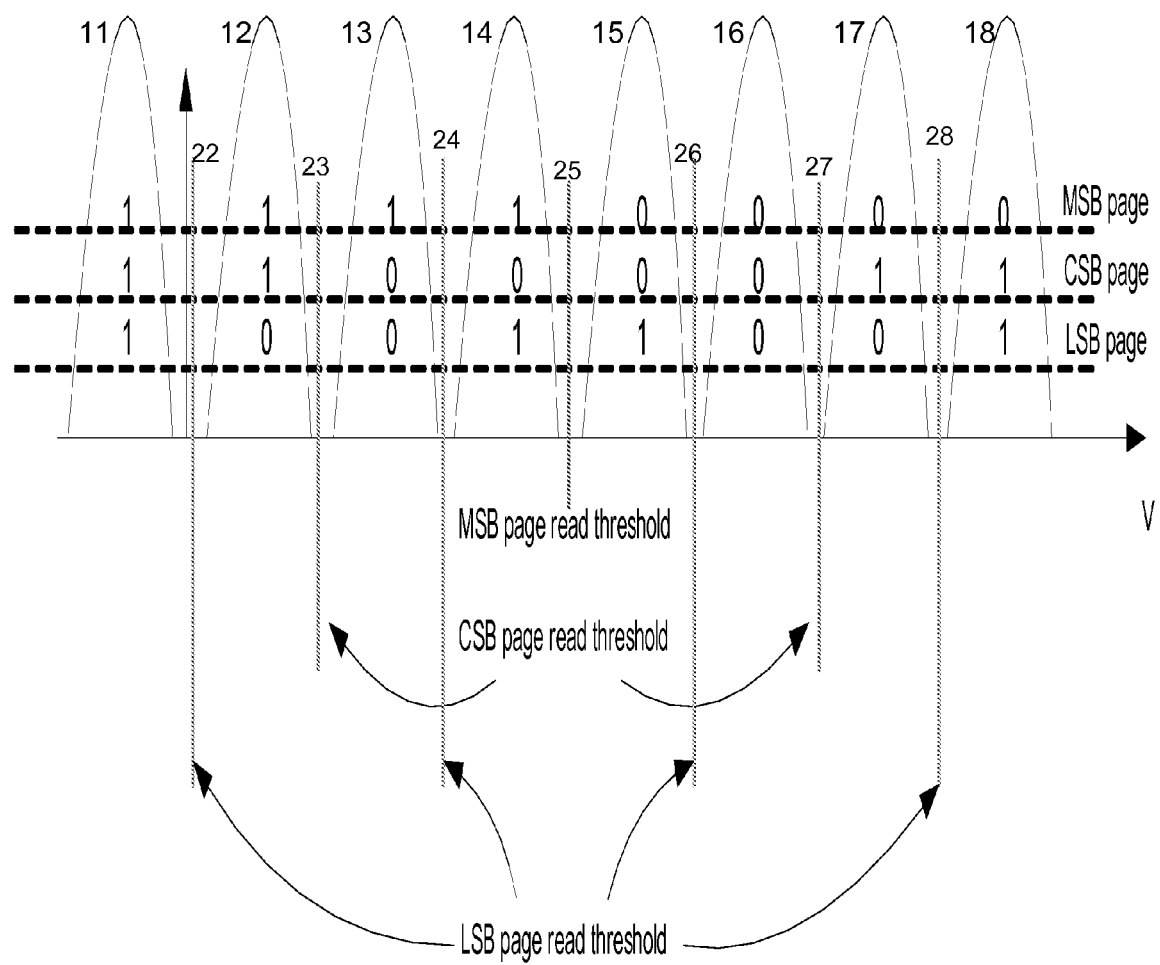
FIG. 1 illustrates a prior art voltage threshold distribution.
Figure 2:
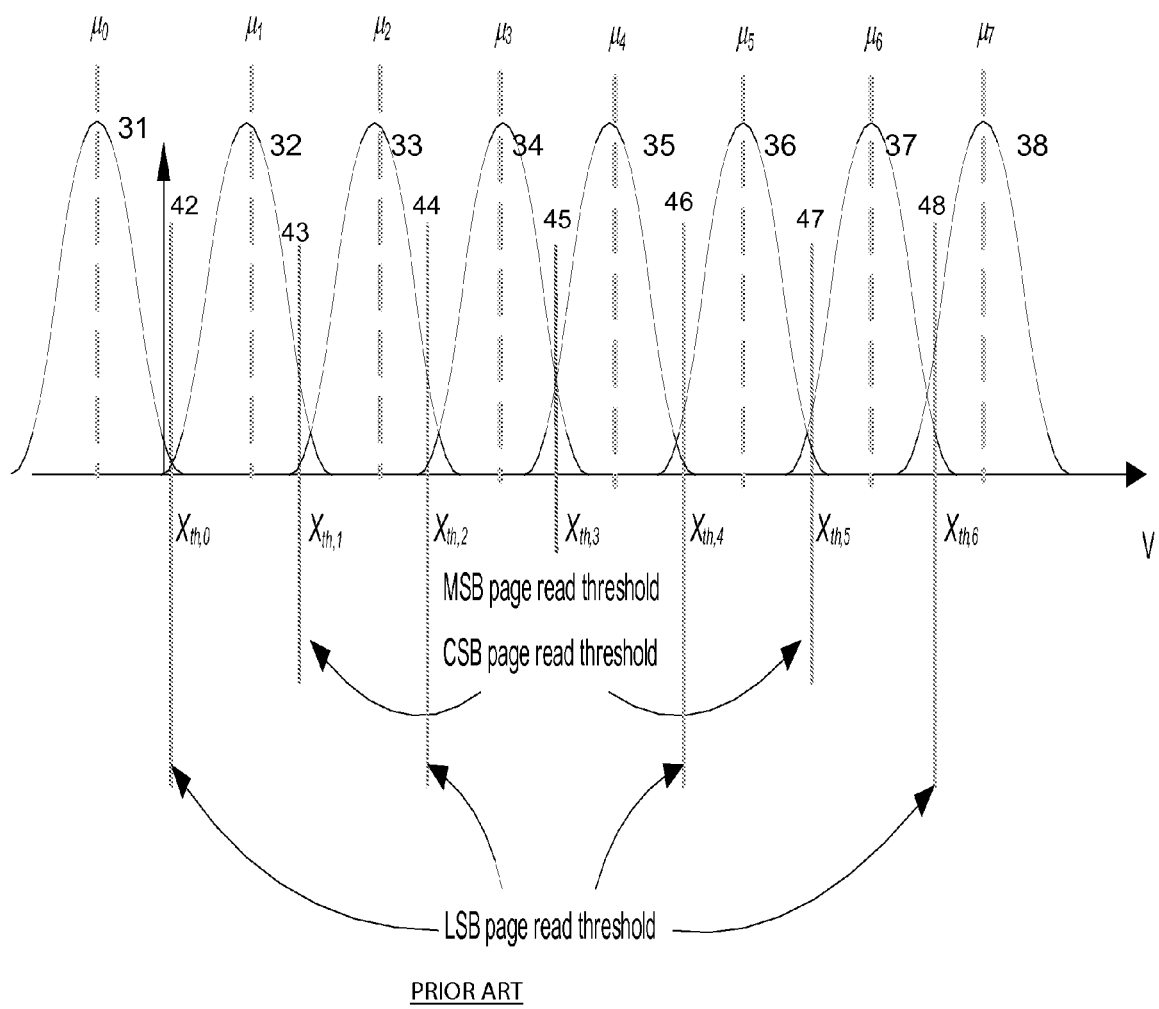
FIG. 2 illustrates a prior art voltage threshold distribution.

An embodiment of the invention may provide a method for programming a flash memory. The flash memory may include flash memory cells capable of storing multiple bits. The method includes providing multiple groups of uncoded bit error rates (UBERs), where each group can comprise UBERs for a plurality of page types. Each page type can be associated with a different bit of the memory cell's multiple bits. A page describes a set of cells that are jointly programmed or read within a single command. Typically, a page size may be 4 kb+256b (information+redundancy) or 8 kb+448b (info+redundancy), or any other suitable page size. It will be recognized that embodiments of the invention may be applied to cells of a single page, cells of a plurality of pages, or a subset of cells of a page.

The method may select a group of code rates out of multiple groups of code rates, where each group of code rates can include code rates for a plurality of page types. The selected group of code rates can be associated with a group of UBERs that may support a highest average UBER out of the multiple groups of UBERs, where each UBER of the selected group can be obtained under a desired code rate constraint. An encoding and programming scheme may be determined based on the selected group of UBERs.

Another embodiment of the invention may provide a system that can include a flash memory unit having cells each capable of storing multiple bits, an uncoded bit error rate generator that provides multiple groups of UBERs, where each group can include UBERs for a plurality of page types and where each page type may be associated with a different bit of the multiple bits per cell. The system further can include a selector that may select a selected group of code rates out of multiple groups of code rates, where each group of code rates can include code rates for the plurality of page types, where the selected group of code rates may be associated with a group of UBERs having the highest average UBER out of the multiple groups of UBERs. Each UBER of the selected group may be obtained under a desired code rate constraint.

The system further can include a programming scheme determination module that determines an encoding and programming scheme that may be based on the selected group of UBERs.

Another embodiment of the invention may provide a method for programming a flash memory having cells capable of storing multiple bits. The method includes providing multiple pairs of MSB page UBERs and LSB page UBERs; where each MSB page may be associated with a MSB bit of the multiple bits and each LSB page may be associated with a LSB of the multiple bits. The method can include selecting a selected MSB page code rate and a selected LSB page code rate so that a selected MSB page UBER associated with the selected MSB page code rate and a selected LSB page UBER associated with the selected LSB page code rate may support a highest average UBER out of the multiple pairs of MSB page UBERs and LSB page UBERs. The selected MSB page code rate and the selected LSB page code rate can be obtained under a desired code rate constraint. The method further can include an encoding and programming scheme based on the selected MSB page UBER, the selected MSB code rate, the selected LSB page UBER, and the selected LSB code rate.

An embodiment of the invention may provide a system that can include a flash memory unit having cells capable of storing multiple bits, an uncoded bit error rate generator that provides multiple pairs of MSB page UBERs and LSB page UBERs, where each MSB page may be associated with a MSB bit of the multiple bits and each LSB page associated with a LSB of the multiple bits. The system can further include a selector that may select a selected MSB page code rate and a selected LSB page code rate so that a selected MSB page UBER associated with the selected MSB page code rate and a selected LSB page UBER associated with the selected LSB page code rate may provide a highest average UBER out of the multiple pairs of MSB page UBERs and LSB page UBERs. The selected MSB page code rate and the selected LSB page code rate may be obtained under a desired code rate constraint. The system may further include a programming scheme determination module that may determine an encoding and programming scheme based on the selected MSB page UBER, the selected MSB code rate, the selected LSB page UBER, and the selected LSB code rate.

Joint Error Code Correction and Uncoded Bit Error Rate Selection

In accordance with a method embodying the invention, information can be encoded by an error correction code (ECC) and then stored in a flash memory. The bit error rate of the entire encoding and programming sequence may be a function of the bit error rate of the encoding scheme and of the bit error rate of the flash memory itself—the uncoded bit error rate.

The following discussion details a trade-off between encoding parameters and flash memory parameters. The flash memory parameters can include a voltage level distribution that may exhibit an UBER. A page-type UBER may be the UBER obtained when reading with optimal voltage thresholds. Alternatively, the UBER may be obtained from reading voltage thresholds that can be provided by the controller system voltage threshold allocation algorithm.

The mapping between UBERs and programming parameters can be calculated, measured or evaluated in various manners. Desired voltage level distributions can be obtained by controlling programming parameters, performing pre-equalization and the like.

Figure 7:
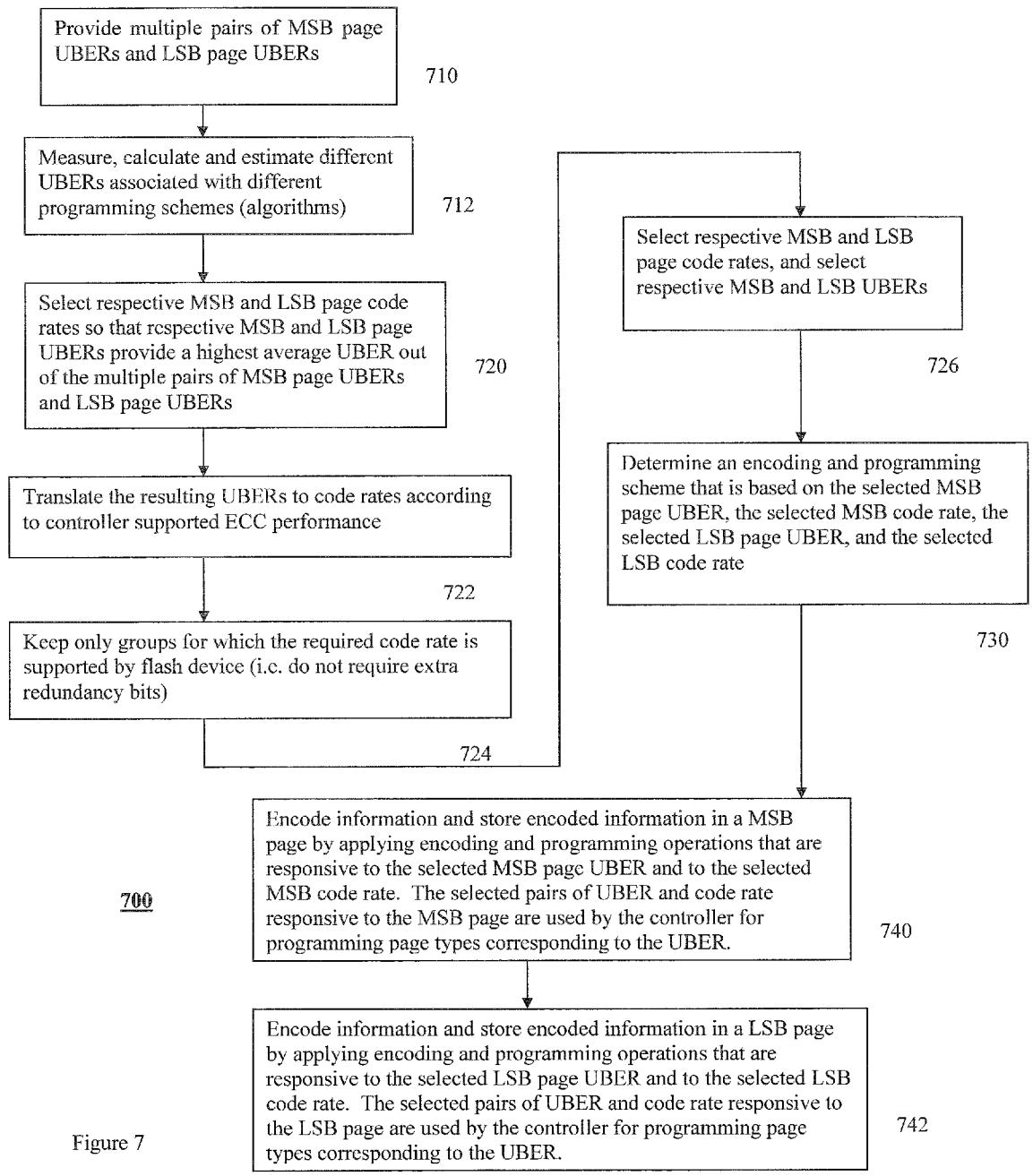
FIG. 7 illustrates a method according to an embodiment of the invention.

FIG. 7 illustrates process 700 for programming a flash memory, according to an embodiment of the invention.

Process 700 provides multiple pairs of MSB page UBERs and LSB page UBERs, step 710. These multiple pairs of pages can appear in two-bit-per-cell memory module. In memory modules that include more than two-bits-per-cell there are groups of UBERs, where every group includes the associated UBER per page type. Thus, a single group size may be equal to the number of bits per cell. Pages of different types are associated with different bits of the multiple bits that can be stored in the flash memory cells. For example, LSB pages can be associated with the LSBs stored in each cell of one or more physical pages of the flash memory. MSB pages can be associated with the MSBs stored in each cell of one or more physical pages of the flash memory.

Different UBERs associated with different voltage levels distributions can be estimated, calculated, and measured, step 712, with different programming schemes or algorithms. The different voltage level distributions can be obtained by applying different programming parameters, such as different programming steps, different initial programming pulse values, and the like. The different voltage level distributions can differ from each other by the spacing between lobes, the width of the lobes, and the symmetry (or asymmetry) of each lobe. The UBERs can be evaluated for different points in time during the lifespan of the pages—e.g., beginning of life, end of life, mid-life, and the like.

Process 700 may include pre-equalizing multiple pages of the flash memory in different manners to provide the multiple pairs of MSB page UBERs and LSB page UBERs. The pre-equalizing can include programming these pages to obtain the different voltage level distributions.

Process 700 may take into account a desired code rate range and does not have to account for UBERs that in combination with the desired code rate range do not achieve a target bit error rate.

Process 700 continues at step 720 by selecting a selected MSB page code rate and a selected LSB page code rate so that a selected MSB page UBER associated with the selected MSB page code rate and a selected LSB page UBER associated with the selected LSB page code rate provide a highest average UBER out of the multiple pairs of MSB page UBERs and LSB page UBERs. The selected MSB page code rate and the selected LSB page code rate can be obtained under the desired code rate range.

Figure 5:
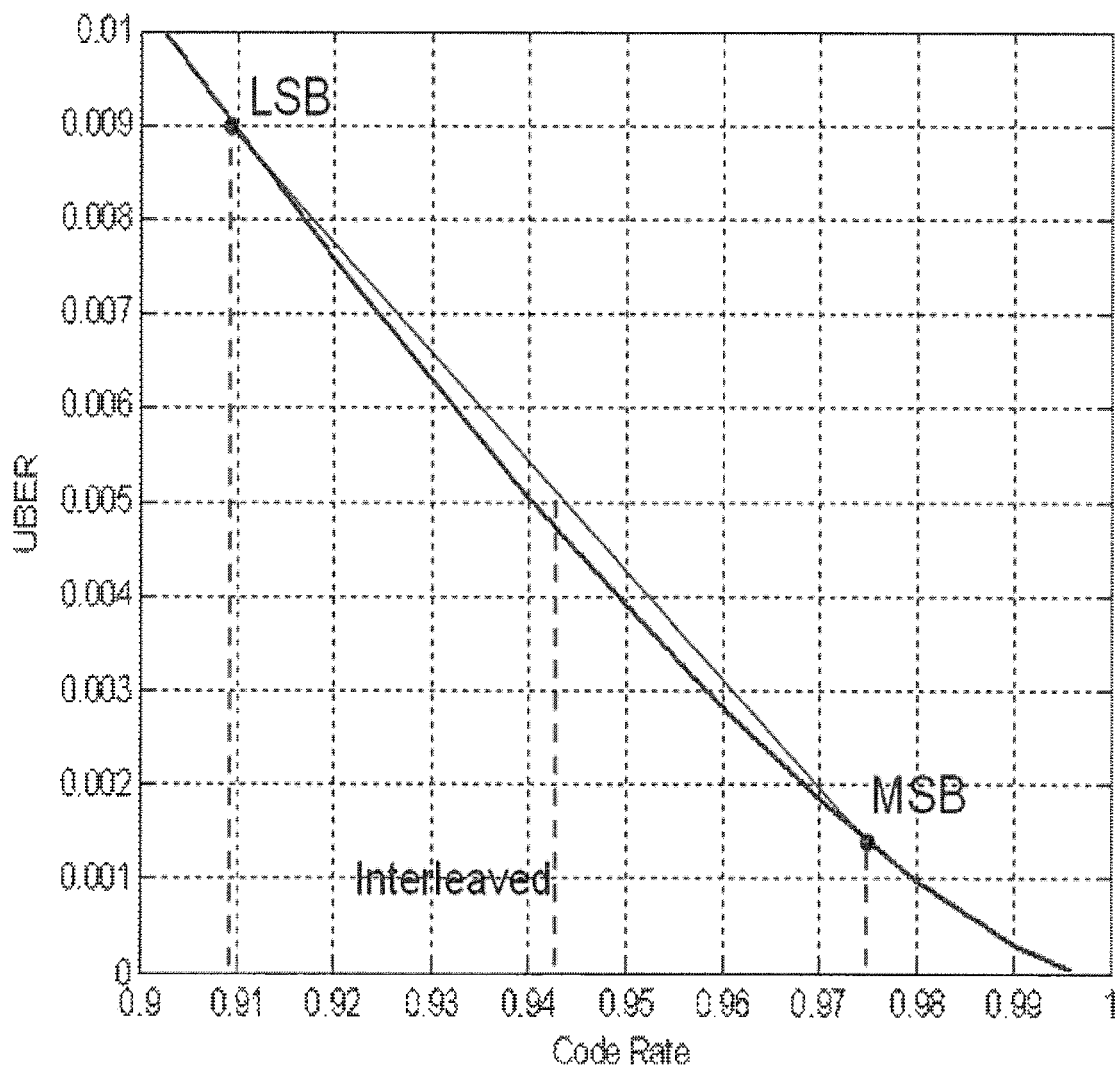
FIG. 5 illustrates a relationship between uncoded bit error rates and code rates according to an embodiment of the invention.

According to an embodiment of the invention process 700 may include: (i) translating the resulting UBERs to code rates according to controller-supported ECC performance, step 722, and keeping only groups for which the required code rate may be supported by flash device (i.e., do not require extra redundancy bits), step 724; and (ii) selecting the selected MSB page code rate, the selected LSB page code rate, the selected MSB page UBER and the selected LSB page UBER such as to comply with the calculated relationship, step 726. Non-limiting examples of such relationships are illustrated in FIG. 5.

Process 700 determines, at step 730, an encoding and programming scheme that may be based on the selected MSB page UBER, the selected MSB code rate, the selected LSB page UBER, and the selected LSB code rate.

Information may be encoded and stored in a MSB page, step 740, by applying encoding and programming operations that are responsive to the selected MSB page UBER and to the selected MSB code rate. Information may be encoded and stored in a LSB page by applying encoding and programming operations that are responsive to the selected LSB page UBER and to the selected LSB code rate, step 742. For both steps 740 and 742, the selected pairs of UBER and code rate responsive to the MSB page (step 740) or the LSB page (step 742) are used by the controller for programming page types corresponding to the UBER.

Process 700 may include programming an MSB page by utilizing a programming operation that facilitates non-uniform voltage level distribution in which lobes are not equally spaced from each other.

Figure 8:
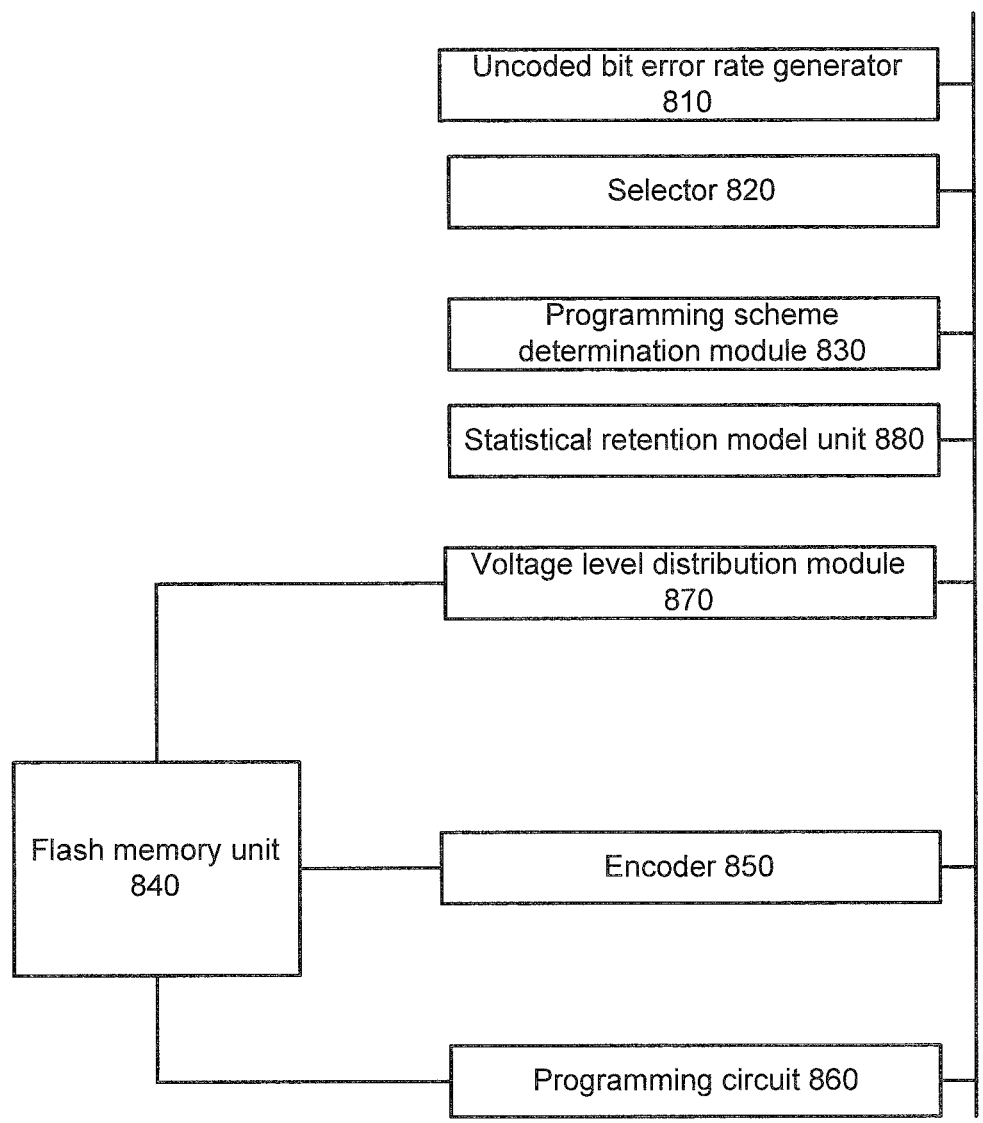
FIG. 8 illustrates a system according to an embodiment of the invention.

FIG. 8 illustrates a system 800 according to an embodiment of the invention. System 800 includes (i) an uncoded bit error rate generator 810 that provides multiple pairs of MSB page UBERs and LSB page UBERs; (ii) a selector 820 that selects a MSB page code rate and selects a LSB page code rate so that a selected MSB page UBER associated with the selected MSB page code rate and a selected LSB page UBER associated with the selected LSB page code rate provide a highest average UBER out of the multiple pairs of MSB page UBERs and LSB page UBERs, wherein the selected MSB page code rate and the selected LSB page code rate are obtainable under a desired code rate range; (iii) a programming scheme determination module 830 that determines an encoding and programming scheme that may be based on the selected MSB page UBER, the selected MSB code rate, the selected LSB page UBER and the selected LSB code rate; and (iv) a flash memory unit 840, that includes multiple LSB pages and multiple MSB pages.

System 800 further includes (v) an encoder 850 that encodes information by applying encoding operations that are responsive to either one of the selected MSB code rate and the selected LSB code rate; (vi) a programming circuit 860 that programs encoded information to a LSB page by applying programming operations that are responsive to the selected LSB page UBER and that programs encoded information to a MSB page by applying programming operations that are responsive to the selected MSB page UBER, (vii) a voltage level distribution module 870 that estimates and/or measures voltage level distributions, and (viii) a statistical retention model unit 880 that generates a statistical retention model and also updates the statistical retention model.

System 800 may be configured to perform the steps of Process 700 of FIG. 7. The uncoded bit error rate generator 810 contains multiple groups of UBER, where each group contains the UBER per page-type. Every group may be created from a set of corresponding programming algorithms (programming scheme), which at end of life achieves the group UBER. The group UBER at end-of-life may be defined as the UBER resulting from reading with (near) optimal voltage thresholds at end-of-life. End-of-life may be defined here as the case of programming after maximal P/E cycles, and retention test.

The uncoded bit error rate generator 810 receives input from voltage threshold scans, and corresponding read voltage thresholds. Selector 820 receives groups of UBER and associated code rates, and outputs a single group for which the total code rate may be supported by the target device, and achieves the highest average UBER. The programming scheme determination module 830 receives different programming algorithms, and associated different flash parameters to be used for obtaining different pre-equalization results. The selector 820 can choose the programming scheme that corresponds to the selected group of code rates. The statistical retention model 880 uses the retention test specification parameters—e.g., configuration of the flash vendor and technology, number of cycles and the retention duration to be emulated (for instance, 10 years). The voltage level distribution module 870 receives a set of predefined read thresholds from which the voltage threshold distribution can be generated by reading from the flash at every specified threshold level. The encoder 850 receives the code rates from selector 820, and uses a code rate which corresponds to a page type. The encoder 850 may be configurable to support the set of selected code rates.

Figure 9:
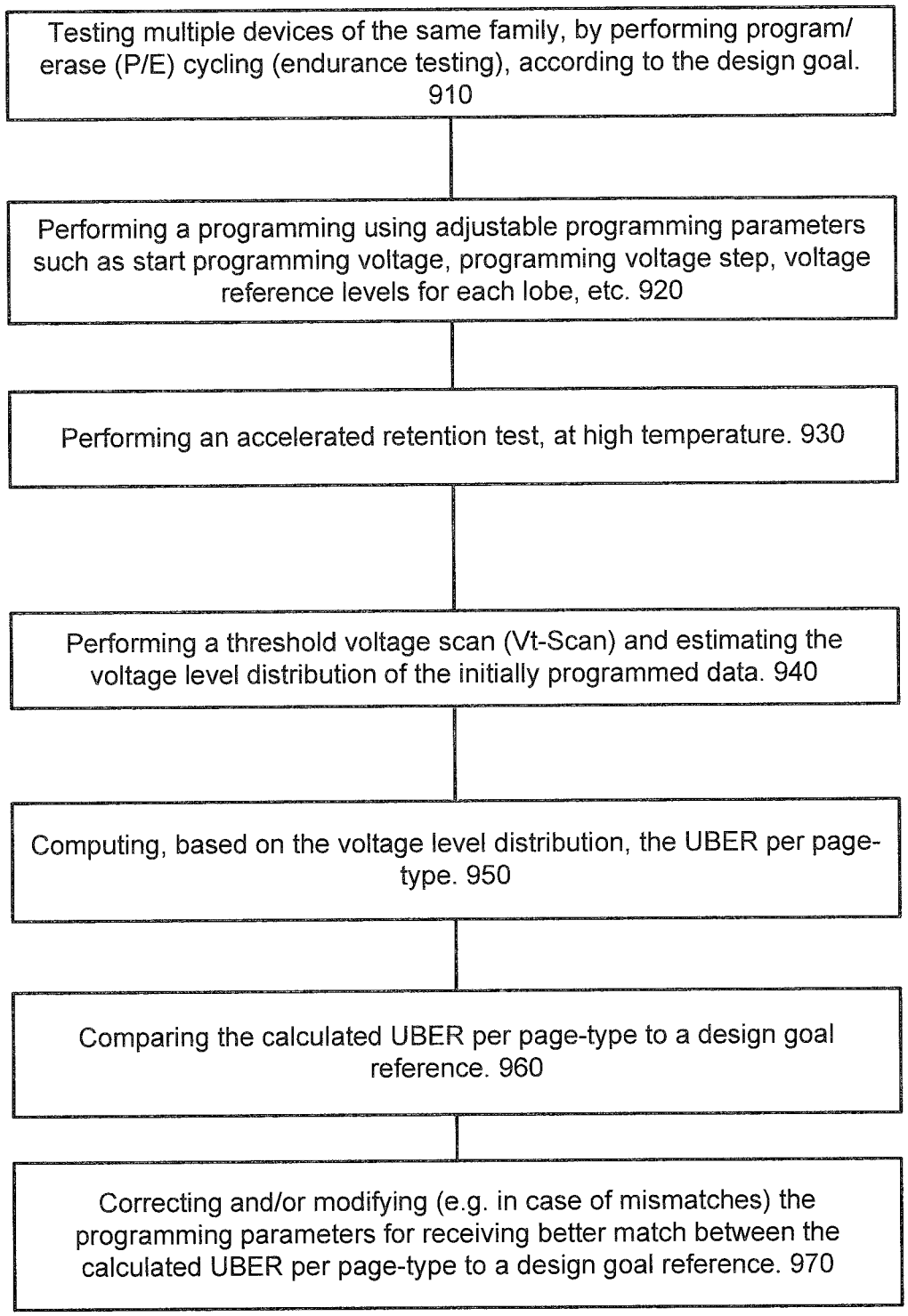
FIG. 9 illustrates a method according to an embodiment of the invention.
Figure 10:
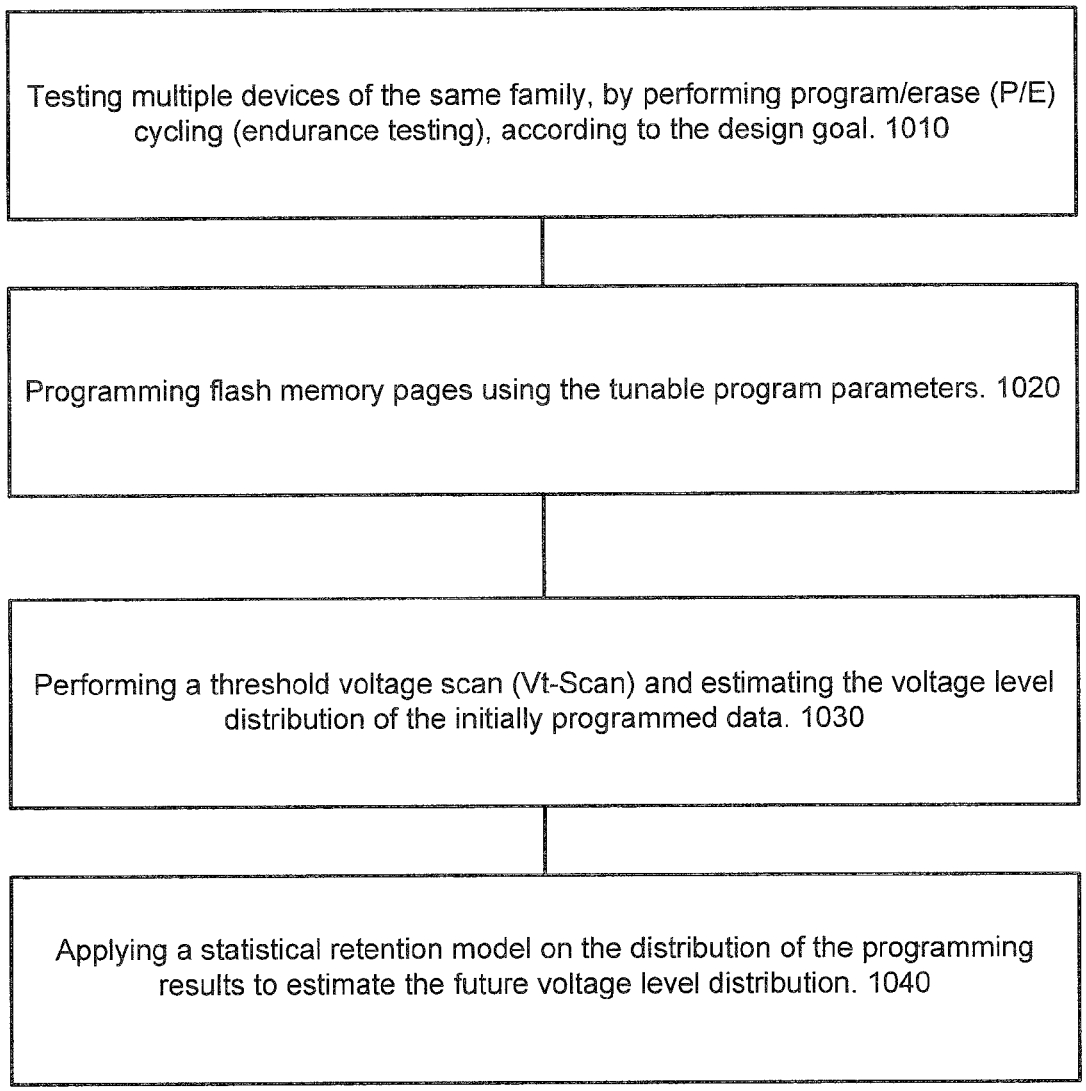
FIG. 10 illustrates a method according to an embodiment of the invention.

The voltage level distribution module 870 and the programming circuit 860 are configured to perform the steps of Processes 900 and 1000 of FIGS. 9 and 10.

Figure 11:
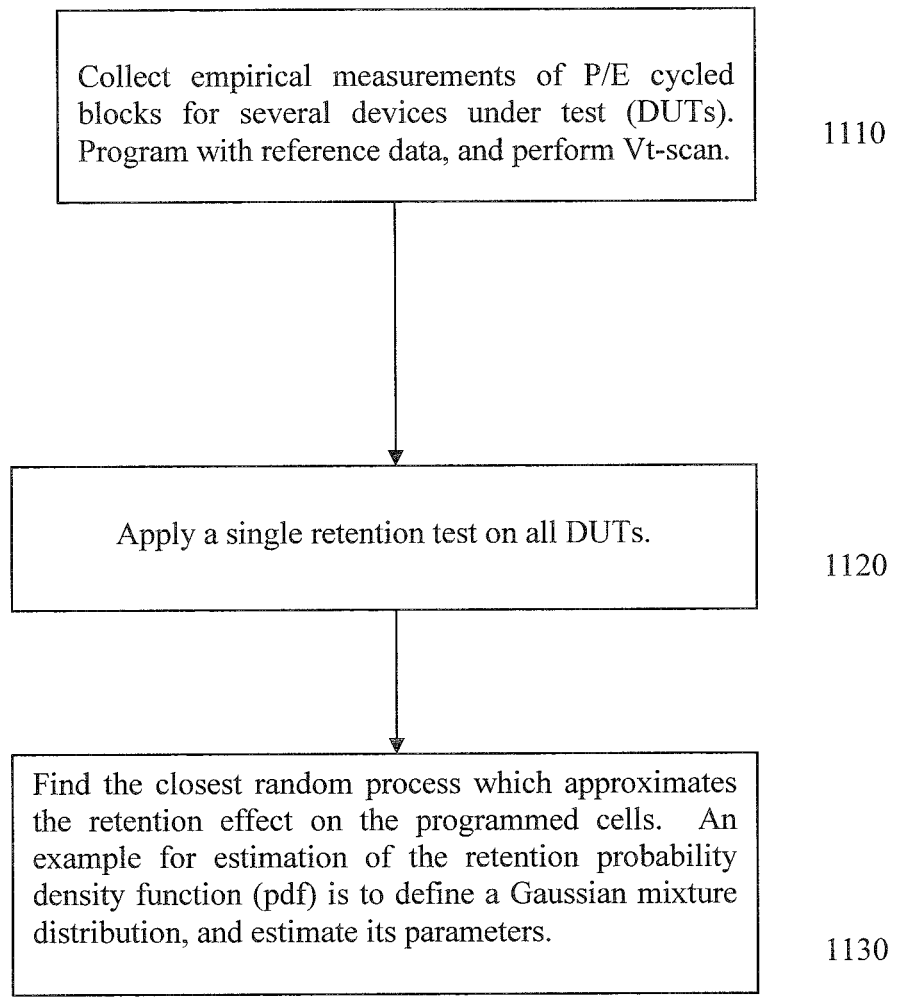
FIG. 11 illustrates a method for creating a statistical retention model according to an embodiment of the invention.

The statistical retention model unit 880 may be configured to perform the steps of Process 1100 of FIG. 11.

Flash memory unit 840, encoder 850, and programming circuit 860 can form a memory module. In an embodiment of system 800, the uncoded bit error rate generator 810, the selector 820, and the programming scheme determination module 830 can optionally belong to a stand alone computer but this may not be necessarily so.

The programming circuit 860, can, for example, pre-equalize multiple pages of the flash memory in different manners to provide the multiple pairs of MSB page UBERs and LSB page UBERs.

The uncoded bit error rate generator 810 can be arranged to calculate a relationship between UBER values and code rate values for the desired code rate range.

The selector 820 can be arranged to select the MSB page code rate, the LSB page code rate, the MSB page UBER and the LSB page UBER such as to comply with the calculated relationship.

The programming circuit 860 can program an MSB page by utilizing a programming operation that facilitates a non-uniform voltage level distribution.

The selected encoding and programming scheme may be used as a controller configuration for a range of P/E cycles, and for all or a subset of the memory cells. The above-described process may be done once for a family of flash devices during manufacturing. The result of this process may be used for all flash memories having the same statistical characteristics and response to the chosen pre-equalization scheme.

The capacity (code rate) as function of the uncoded input bit error rate (BER) may be a convex function. The Hamming bound, which may be the capacity for hard input depends on the code length, minimum distance and the input UBER, gives an important limitation on the efficiency with which any error correcting code can utilize the space in which its code words are embedded. The Hamming bound is well known and details can be found, for example, in *Algebraic Codes for Data Transmission*, Richard E. Blahut, chapter 12, pages 375-416, Cambridge University Press, 2003.

$$C(p_e, D, N) = \frac{1}{B(D, N)} \int_0^{p_e} z^{\lfloor D/2 \rfloor}(1-z)^{N-\lfloor D/2 \rfloor} \, dz$$

where D is the code minimum distance, N is the code bit length, $p_e$ is the input UBER, and B(D,N) is the complete Beta function, defined by $$B(D, N) = \int_0^1 z^{\lfloor D/2 \rfloor}(1-z)^{N-\lfloor D/2 \rfloor} \, dz$$

An exemplary plot of the sphere packing Hamming bound is given in FIG. 5. The Hamming bound may be computed for data length of K=8192 Bytes, with additional redundancy of 5.75%, which corresponds to 500 Bytes, which gives a total codeword length N=8692 Bytes.

The Hamming bound may be plotted for a bit error probability of $10^{-15}$, which may be a common requirement for flash memories.

FIG. 5 illustrates a code design for different page types by using pre-equalization, according to an embodiment of the invention. By performing pre-equalization the initial UBER can be controlled for the page types.

This adds a new degree of freedom in the rate selection per code, which corresponds to a page-type. This is different from the prior art where the lobe spacing may be equal, the UBER for MSB/CSB/LSB (in case of 3 bits per cell) under the prior art behaves with good approximation according to $P_{e,MSB}=p_e$, $P_{e,CSB}=2p_e$, $P_{e,LSB}=4p_e$.

In the example of FIG. 5, the flash memory stores two bits per cell. When using a single code for both MSB and LSB pages by performing interleaving between the pages, or by pre-equalization for equalizing the UBER for the LSB and MSB pages—The highest UBER which can be reliably decoded (to provide BER<$10^{-15}$) may be UBER≤0.00475 (at code rate 0.9425). However, when using two codes, and performing pre-equalization, a higher average UBER can be reliably decoded. In this example, the MSB requirement may be UBER≤0.0015, and the LSB requirement may be UBER≤0.009. The corresponding code rates of the page types are 0.975 and 0.91 for the MSB and LSB pages, respectively. This may be a direct result of the convexity of the Hamming bound. The joint pre-equalization and code rate assignment to different page types can lead to higher performance.

In the example of FIG. 5 joint pre-equalization and unequal code-rate for different page types allows operation at average UBER which may be higher by 10%. In addition, it is worth emphasizing that in prior art equal lobe spacing, using a different code for each page type may be better than interleaving, however the highest operational UBER may be smaller than in the case of optimized pre-equalization and rate allocation.

Naturally, in practical applications, the actual code performance may be degraded from the capacity bound used in FIG. 5, however usually the same convex curve may be obtained for every code family. This was also demonstrated for a family of multi-dimensional folded BCH codes, as disclosed in U.S. patent application Ser. No. 12/509,748, filed Jul. 27, 2009 and entitled "Encoding Method and System, Decoding Method and System," assigned to the assignee of the present application, the content of which is hereby incorporated by reference in its entirety.

In general, the optimal operational points on this curve can be found by solving a simple convex optimization of maximizing the average UBER over the line connecting every two valid working points. For every rate selection for the MSB page type, the LSB rate may be determined by the average rate constraint (dictated by the available redundancy).

It is noted that for a zero UBER for MSB, the LSB pages may use all the redundancy, and highest UBER may be supported; however, in many cases it may not be a practical requirement to have a zero UBER with probability of $10^{-15}$. Therefore, this optimization may be performed along with the practical constraints of the pre-equalization capabilities since very low UBER for one page type might induce very high UBER for other page types. Thus, pre-equalization and code design are tightly coupled, and desirably should not be done separately.

Figure 6:
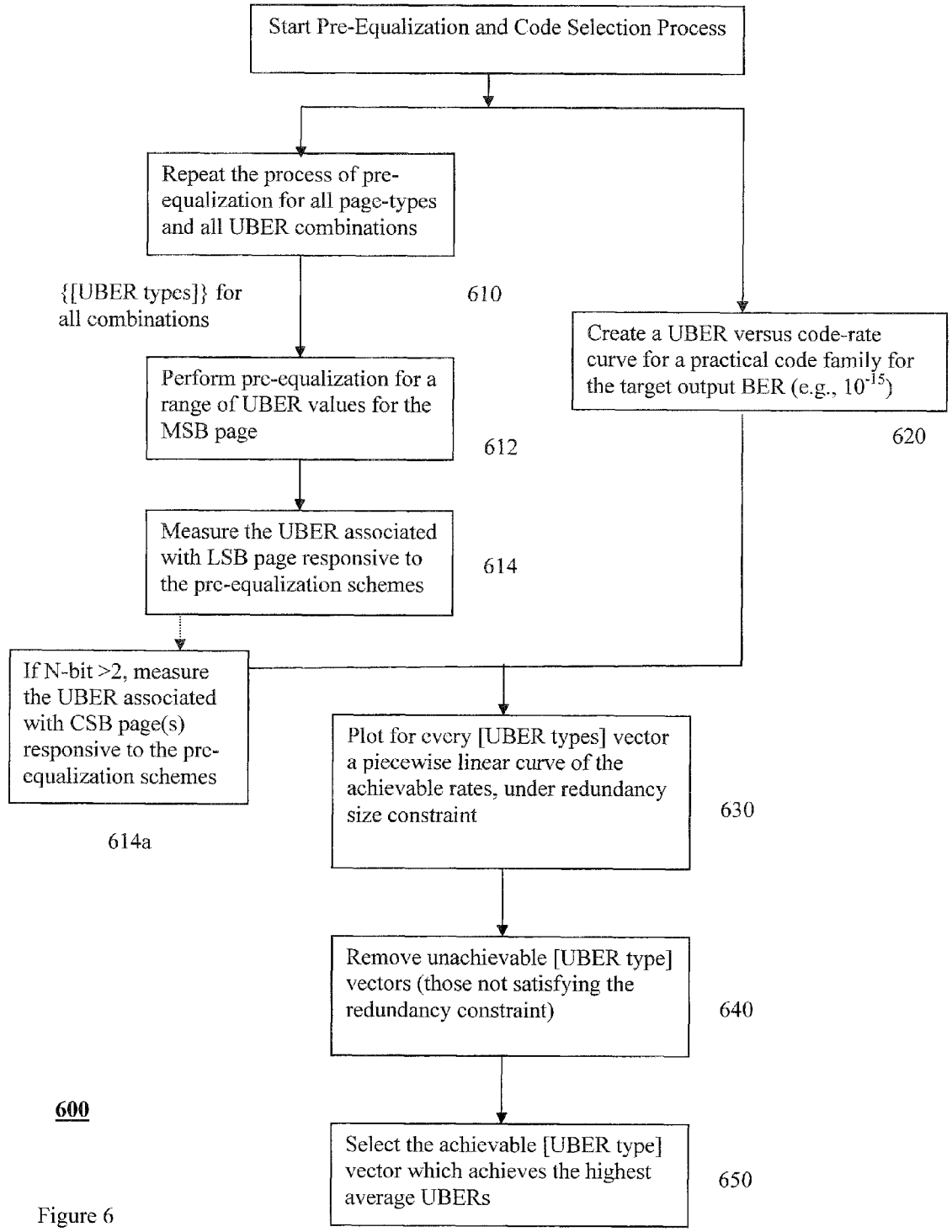
FIG. 6 illustrates a method according to an embodiment of the invention.

FIG. 6 illustrates Process 600 according to an embodiment of the invention.

Process 600 repeats the process of pre-equalizing multiple flash memory pages for all page types (MSB and LSB) and for at least a group of UBERs, step 610. Pre-equalization is the process of changing the programming scheme such that the voltage threshold distributions can meet some pre-defined goal. This goal can also be characterized by the end-of-life UBER. Therefore, pre-equalization may be part of a program method variation which yields different UBER groups.

Pre-equalization (as discussed above) can be performed for a range of UBER values for the MSB page, starting with the lowest possible UBER, and up to highest UBER that can be supported by a practical code for the MSB page, step 612. For every MSB UBER, there can be an associated LSB page UBER, respectively. The UBER values are responsive to the pre-equalization scheme (i.e., programming algorithm).

At step 614, the UBER associated with an LSB page responsive to the pre-equalization schemes may be measured. Process 600 can be readily adapted to include N-bits per cell devices by including measurement of the UBER associated with the CSB page(s) of the N-bit per cell device, step 614a.

A UBER vector may be created which contains the UBER for each page type. From every vector a piece-wise linear curve of UBER versus practical code rate may be created, using a family of codes that achieve a desired BER (also referred to as target output BER) for the given input UBER, step 620. A non-limiting example of such a curve is illustrated in FIG. 5. Step 620 may be an operation dictated by the coding system to be used. In some embodiments, the coding system may be configured or configurable to multiple rates. For example, in some embodiments, for every rate there may be a corresponding UBER at which the target output BER (e.g., 1e-15) can be guarantied. Step 610 generates UBER groups by pre-equalization, which may be the process of changing the programming scheme such that the voltage threshold distributions will meet multiple pre-defined goals. The end-of-life UBER vector can also characterize these goals. Accordingly, Process 600 begins at step 605, where the pre-equalization process may be repeated (step 610), and a UBER versus code-rate curve may be created (step 620) dependent on the conditions discussed above. That is, step 630 receives two inputs: 1) UBER versus achievable code-rate; and 2) multiple pairs of UBERs corresponding to different pre-equalization schemes (i.e., programming algorithms).

At step 630, plotting for every UBER vector a piecewise linear curve of the achievable rates under redundancy size constraints may be performed.

Step 630 can include connecting a line, for every practical UBER vector, with codes at corresponding rates. This creates multiple piecewise linear curves.

Unachievable UBER curves that do not satisfy the redundancy size constraint are removed, step 640. Removing all curves for which the average code rate of all page types do not satisfy the redundancy constraint may be included at step 640.

An achievable UBER curve that achieves the highest average UBER may be selected, step 650.

Choosing the code pair which provides the highest average UBER from all valid MSB/LSB pairs can be included at step 650.

It is noted that while the following example is offered for a flash memory unit that implements two-bits per cell, the invention is not so limited. The embodiments of the invention may also used, mutatis mutandis, for other implementations of bits-per-cell.

The method may continue with creating and/or modifying a flash apparatus to implement the code pair.

This method of code design can be generalized for the case of soft inputs. That is, there are applications where soft decoding can be performed to further improve the system performance and overcome higher UBERs. For those applications, the pre-equalization method does not change, and the basic methods are the same. Only the UBER versus code rate curve generated has to be updated according to these guidelines.

It should be noted that the disclosed methods may be used for the designing/creating/manufacturing/updating/using of different flash memory units—which are also covered in the scope of the invention.

It is noted that the herein disclosed methods and systems may provide solutions for programming for a specific level distribution at end of life, such that probability of error may not be necessarily equal for every read threshold. This pre-equalization has two exemplary applications: 1) May allow using a single code for different page types (for equal UBER per page-types). This may allow faster program/read from Memory. 2) For applications that allow usage of different code-rates for different page types, increase the average UBER by joint pre-equalization and code design per page-type. However, the invention is not so limited and has other applications as will be understood by a person having ordinary skill in the art.

It is noted that the herein disclosed methods and systems may provide solutions for joint pre-equalization and code rate selection for different page types in multi-level per cell memories. The benefit of such design may be in the direct improvement for the Flash memory unit life-time. The joint optimization allows reliable operation for higher input UBER. The result may be larger number of cycles to be supported, and/or faster programming/read performance per page.

It is noted that the herein disclosed methods and systems may provide solutions for a direct extension of the method for soft input decoding (for joint pre-equalization and code design).

It is noted that the herein disclosed methods and systems may provide solutions for pre-equalization for at least two bit per cell (2 bpc) multi-level cells (MLC) and/or three bit per cell (3 bpc) MLC programming It is noted that the herein disclosed methods and systems may provide solutions for joint pre-equalization and code design for MLC (two bits) and 3 bpc (three bits) programming.

It is noted that the herein disclosed methods and systems may provide solutions for automatic calibration of programming parameters for pre-equalization.

It is noted that the herein disclosed methods and systems may provide solutions for use in conjunction with adaptive programming, which uses a different set of programming parameters for different cycling ranges.

The systems embodying the present invention can be implemented as discrete components, an integrated circuit, an application-specific integrated circuit, a field programmable gate array, a computer, as firmware to configure a programmable device, or other technologies as would be known by a person of ordinary skill in the art.

UBER Calculation, Estimation or Measurements

Figure 3:
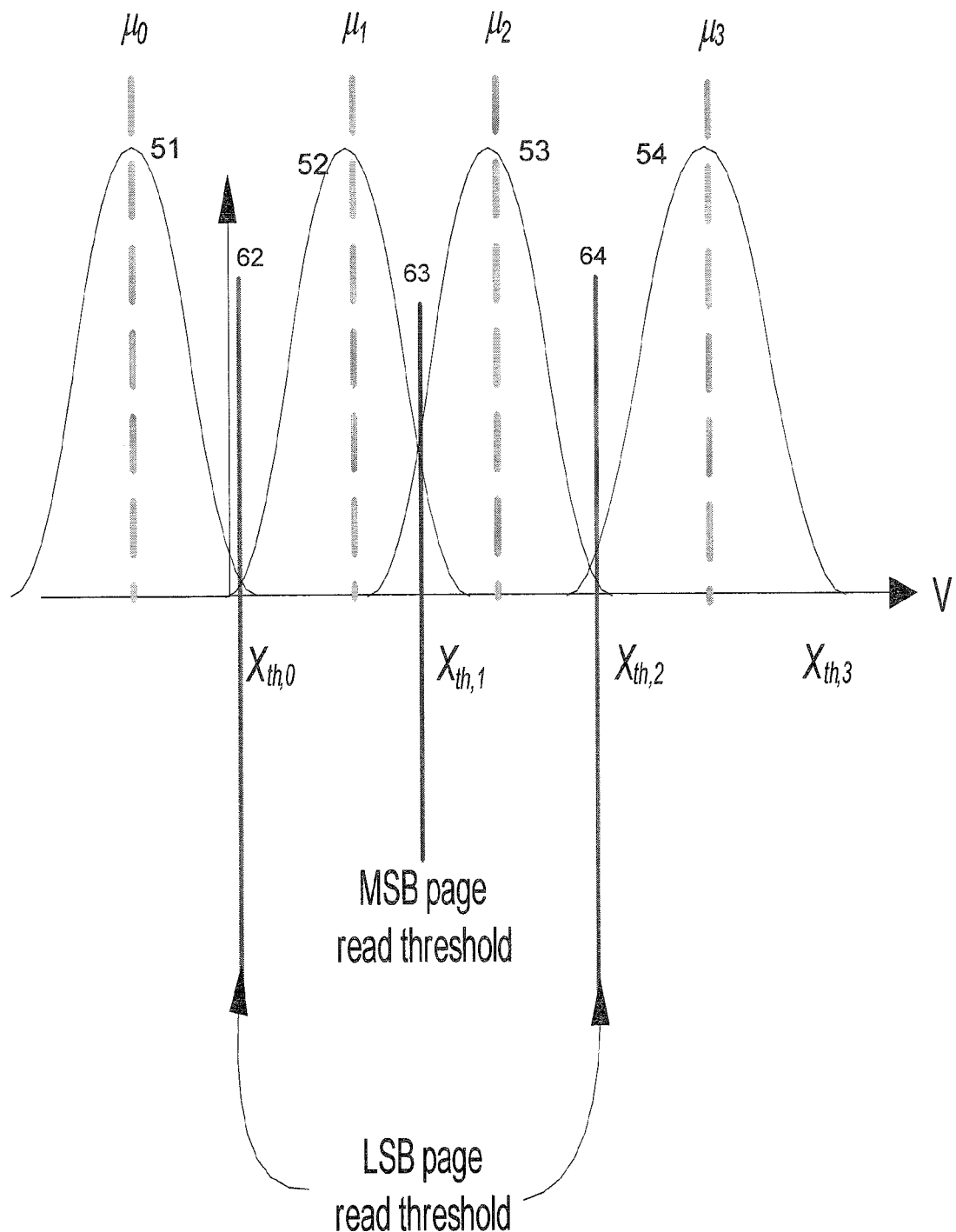
FIG. 3 illustrates a non-uniform voltage threshold distribution according to an embodiment of the invention.

FIG. 3 illustrates a non-uniform voltage level distribution for a 2-bits-per-cell flash memory, according to an embodiment of the invention.

The voltage level distribution may be non-uniform in the sense that the lobes are not evenly spaced from each other—the two central lobes 52 and 53 are closer to each other then to lobes 51 and 54. The overlap between lobes 52 and 53 may be largest for the MSB read threshold 63, and smaller (can be equal) for the LSB read thresholds 62 and 64. Such pre-equalization can be done in order to have an equal UBER for reading LSB and MSB pages.

The suggested method for equating the UBER of different page types can be applied, for example, in solid state disks. A person having ordinary skill in the art will understand other applications of the invention. A solid state disk can include multi-level programmed cells. When using different code rates for the different page types the payload per page may not be fixed in size, and this may induce performance degradation to the management software. This may be due to the fact that the equal lobe spacing may be efficiently accommodated using ECCs at different rates. Because multi-level chips have equal page sizes, a variable payload size may be used.

Alternatively, equal payload sizes can be used, together with interleaving between the page types. This means that MSB and LSB pages may be jointly encoded and decoded. It is noted that while implementable in various embodiments of the invention, implementing such a scheme may have one or more drawbacks. For example, it may be that in such an implementation, the flash can be programmed only after all systematic bits are available. For example, it may be that in such an implementation, when using large coupling sequences for programming, there may be many MSB pages to program before the first LSB page may be available.

According to an embodiment of the invention, in order to overcome such drawbacks, a RAM memory buffer should be used.

However, if the voltage level distributions are pre-equalized to produce equal UBER for all page types, then the most efficient coding scheme may be identical for all page types. This can be done with equal payload size for all page types, and without interleaving between page types.

Figure 4:
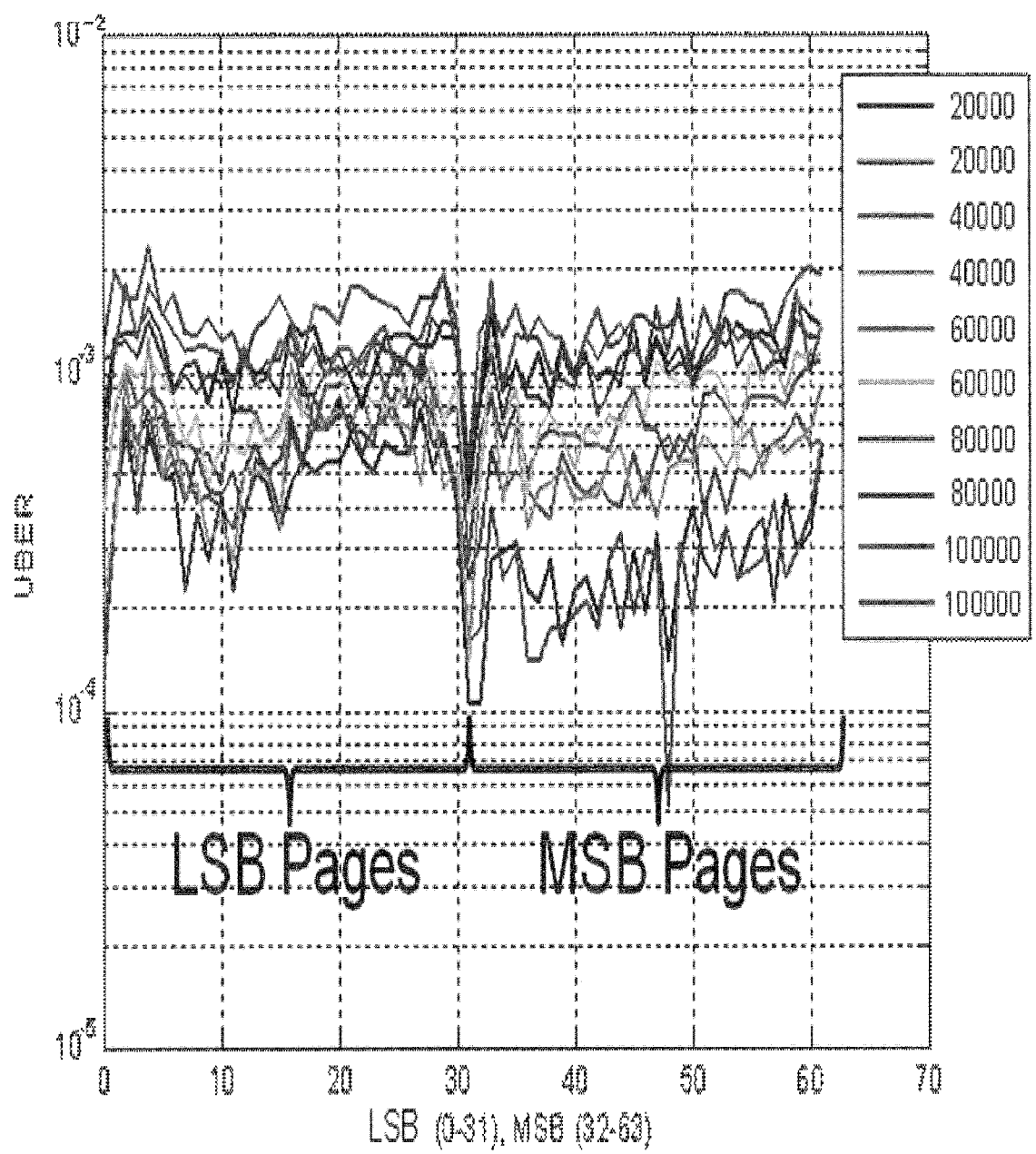
FIG. 4 illustrates an example of uncoded bit error rates for different bits and for different cycles, according to an embodiment of the invention.

FIG. 4 illustrates an example of the UBER observed on a true flash memory unit, which supports two-bits-per-cell programming The UBER may be measured at the end of life of the flash memory unit, defined by 100% P/E cycles and 1 year retention. An example of a flash testing specification may be found in JEDEC STANDARD—Stress-Test-Driven Qualification of Integrated Circuits, JESD47, section 5.5, December 2007.

The test may be performed for different cycle counts, such as 20,000 up to 100,000 cycles. For example, every UBER curve may give the average UBER over a row, for each page-type, wherein the first 32 entries are for the LSB pages for every row, and the next 32 values refer to UBER per row for MSB pages. As may be noticed, the UBER at end-of life are nearly the same for the two page types.

Various methods for evaluating UBERs for different types of pages and for different voltage level distributions are provided. Each of these methods can be incorporated into Process 700, step 710 of FIG. 7.

FIG. 9 illustrates Process 900 for evaluating UBERs for different types of pages and for different voltage level distributions according to an embodiment of the invention.

Process 900 includes steps 910-970.

At step 910 multiple devices of the same family are tested, by performing program/erase (P/E) cycling (endurance testing), according to the design goal.

Programming may be performed, step 920, using adjustable programming parameters such as start programming voltage, programming voltage step, voltage reference levels for each lobe, etc.

An accelerated retention test, step 930, may be performed at temperatures greater than about 55° C. A high temperature bake of a device under test (DUT) emulates the effect of charge distribution over a longer period at lower temperature. As an example, the JEDEC STANDARD (Stress-Test-Driven Qualification of Integrated Circuits, JESD47, section 5.5, December 2007) specifies a 1-year retention test for 100% P/E cycles, e.g., blocks with maximum cycling values must be reliably read after being 1-year in a room at 55° C. Instead of waiting one year after programming every DUT, a bake of 1.5 hours at 150° C. can emulate the 1-year test.

A threshold voltage scan (Vt-scan) may be performed and the voltage level distribution of the initially programmed data may be estimated, step 940.

The UBER per page-type may be computed, step 950, based on the voltage level distribution.

The calculated UBER per page-type may be compared, step 960, to a design goal reference.

At step 970 the programming parameters for receiving better match between the calculated UBER per page-type to a design goal reference are corrected and/or modified (e.g., in case of mismatches).

Another method for evaluating UBERs for different types of pages and for different voltage level distributions may lead to faster calibration of the pre-equalization programming parameters. This method uses a statistical retention model.

FIG. 10 illustrates Process 1000 according to an embodiment of the invention.

Process 1000 includes steps 1010-1040 and can include at least one of steps 950, 960 and 970.

Step 1010 includes testing multiple devices of the same family, by performing P/E cycling (endurance testing), according to the design goal.

Step 1020 includes programming flash memory pages using the tunable program parameters.

Step 1030 includes performing a Vt-Scan, and estimating the voltage level distribution of the initially programmed data.

Step 1040 includes applying a statistical retention model on the distribution of the programming results to estimate the future voltage level distribution. Since step 1040 can be implemented in software it can replace the retention testing, and enable fast tuning of the flash memory unit programming parameters. It is noted that, according to an embodiment of the invention, the pre-equalization parameters setting can be done once for a family of devices. Once the algorithm is finalized, its parameters can be used by the flash controller for the device family. The pre-equalization parameters tuning need not be repeated for every Flash device.

Step 1040 can be followed by steps 950, 960 and 970 (FIG. 9). For simplicity of explanation these stages are not included in FIG. 10.

It is further noted that every set of programming parameters should yield a specific lobe distribution. It is however noted that the flash memory units of the same process may differentiate in their performance—e.g. due to physical mismatches, such as production in different lots, etc. Programming mismatches may be overcome by online tuning of the programming parameters, e.g. according to steps detailed in U.S. Patent Application No. 61/236,911, entitled "A System and a Method of High Reliability Flash", filed Aug. 26, 2009, the contents of which are incorporated herein by reference. This method can be done together with the two methods described above, as part of a running flash controller.

When using a statistical retention model it can be beneficial to update the model. The update can assist in providing more accurate UBER estimations during step 710 of Process 700 or during step 1040 of Process 1000.

FIG. 11 illustrates Process 1100 for creating a statistical retention model according to an embodiment of the invention.

Process 1100 includes steps 1110, 1120 and 1130.

Empirical measurements of P/E cycled blocks for several devices under test (DUTs) can be collected, step 1110. The cycled blocks of all DUTs can then go through a last program operation (and not erased afterwards) with reference data. A voltage level distribution scan may be performed on these programmed blocks.

A single retention test may be applied on all DUTs, step 1120. This single retention test can be done through an accelerated test, e.g., a bake at a temperature greater than about 55° C. may be applied to the DUTs.

The closest random distribution process that approximates the retention effect on the programmed cells may be found, step 1130. An example for estimation of the retention probability density function (pdf) may be to define a Gaussian mixture distribution, and estimate its parameters. The Gaussian mixture pdf may be defined by:

$$f_K(x) = \frac{1}{D}\sum_{k=1}^{K} p_k \frac{1}{\sqrt{2\pi\sigma_k^2}} e^{-\frac{(x-\mu_k)^2}{2\sigma_k^2}}$$

where $p_k$ is a weighting factor, such that $$\sum_{k=1}^{K} p_k = 1,$$

and D is a normalization factor calculated such that the pdf integral is unity. The set of parameters for estimation is $\{p_k, \mu_k, \sigma_k^2\}_{k=1}^{K}$. It is noted that such model can be created for each page and plane, separately. To do this, the number of cycled blocks should be large enough to provide a sufficiently large measurements vector. This estimation problem may be solved by using iterative least mean square error fitting, or by using the expectation maximization (EM) algorithm as presented in *Maximum Likelihood From Incomplete Data Via the EM Algorithm*, A. P. Dempster, N. M. Laird, and D. B. Rubin, pages 1-22, *Journal of the Royal Statistical Society B*, 39(1), 1977.

It is assumed that the read thresholds used are a given input to the pre-equalization process. The read thresholds may be fixed and non-configurable with some Flash memory units. There may be a small number of available threshold sets given by the vendor. In other applications the read thresholds can be configured by the memory controller and, thus, the read location may be optimized to read the memory contents in locations where the overlap of neighboring lobes may be low enough. An example for methods for efficient ways for configuring the read thresholds may be found in PCT Publication No. WO/2009/072102, titled "System and Methods Employing Mock Thresholds to Generate Actual Reading Thresholds in Flash Memory Devices," of Katz, filed Sep. 14, 2008.

Other embodiments of the process can be applied mutatis mutandis to more than two page types (MSB and LSB) as well as to two page types that differ from LSB and MSB. This is at least partially illustrated in FIG. 12.

Figure 12:
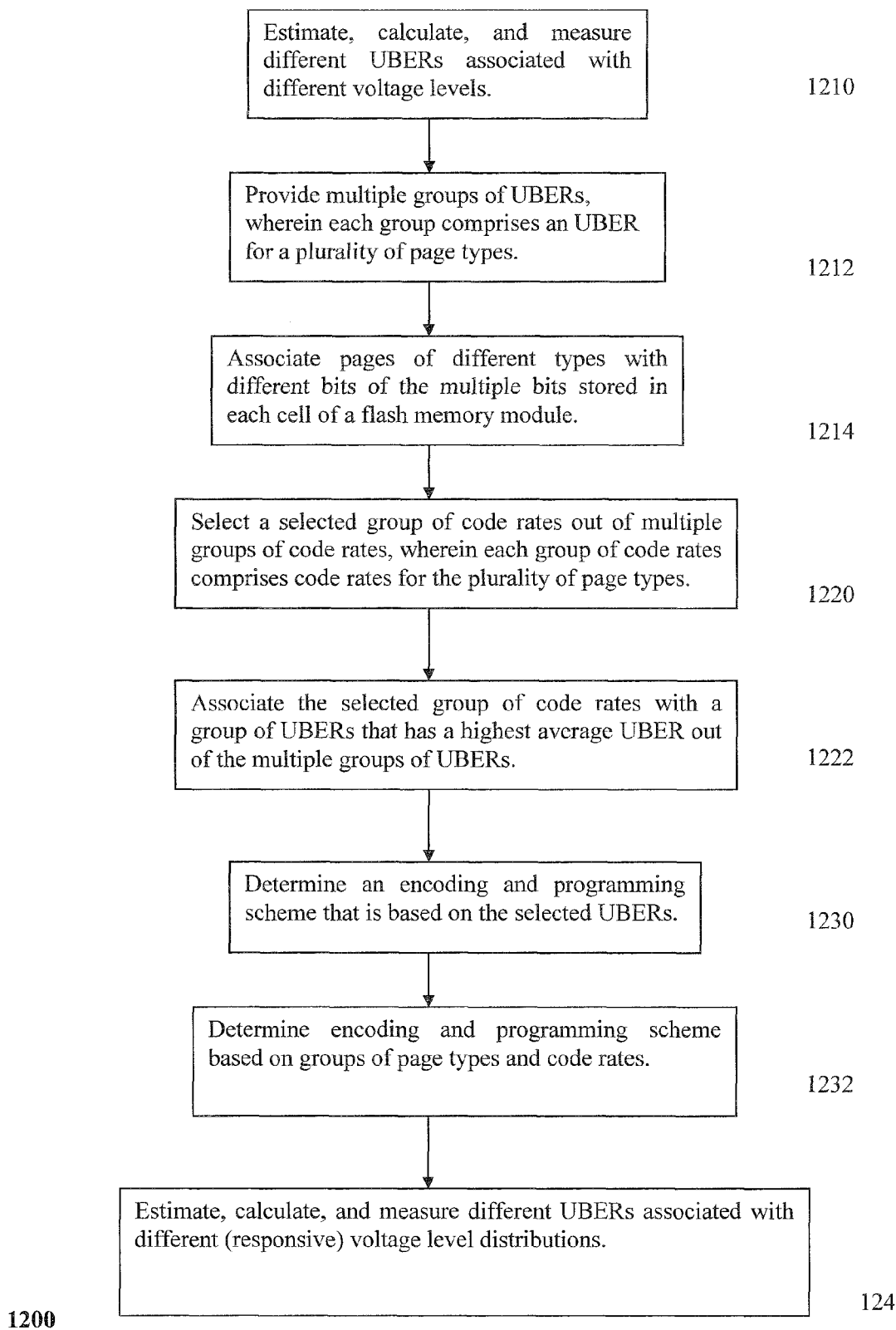
FIG. 12 illustrates a process according to an embodiment of the invention.

FIG. 12 illustrates Process 1200 according to an embodiment of the invention.

Process 1200 estimates, calculates, and measures different UBERs associated with different voltage levels distributions, step 1210. The different voltage level distributions can be obtained by applying different programming parameters such as different programming steps, different initial programming pulse values, and the like.

Multiple groups of UBERs are provided, step 1212, wherein each group comprises a UBER for a plurality of page types. Pages of different type are associated with different bits of the multiple bits stored in each cell of a flash memory module, step 1214.

The different voltage level distributions can differ from each other by the spacing between lobes, by the width of the lobes, by the symmetry (or asymmetry) of each lobe.

The UBER can be evaluated for different points in time during the lifespan of the pages—for example, at beginning of life, end of life, mid-life, and the like.

Step 1212 can include pre-equalizing multiple pages of the flash memory in different manners to provide the multiple groups of UBERs. The pre-equalizing can include programming these pages to obtain the different voltage level distributions.

Step 1212 can include providing multiple pairs of MSB page UBERs and LSB page UBERs.

Conveniently, Process 1200 and steps 1210-1214 can take into account a desired code rate range and can ignore UBERs that in combination with the desired code rate range do not achieve a target BER.

A group of code rates may be selected out of multiple groups of code rates, step 1220, wherein each group of code rates comprises code rates for the plurality of page types. The selected group of code rates may be associated, step 1222, with a group of UBERs that has a highest average uncoded bit rate (UBER) out of the multiple groups of UBERs, wherein each UBER of the selected group may be obtainable under a desired code rate constraint.

Steps 1220-1222 can include calculating a relationship between UBER values and code rate values for the desired code rate range; and selecting the selected group of code rates such as to comply with the relationship.

Steps 1220-1222 can include selecting a selected MSB page code rate and a selected LSB page code rate so that a selected MSB page UBER associated with the selected MSB page code rate and a selected LSB page UBER associated with the selected LSB page code rate support a highest average UBER out of the multiple pairs of MSB page UBERs and LSB page UBERs, wherein the selected MSB page code rate and the selected LSB page code rate are obtainable under a desired code rate constraint.

An encoding and programming scheme that may be based on the selected group of UBERs may be determined, step 1230.

Step 1230 can include determining an encoding and programming scheme that may be based on the selected MSB page UBER, the selected MSB code rate, the selected LSB page UBER and the selected LSB code rate can follow step 1230 at step 1232.

Information may be encoded and stored in each page type by applying encoding and programming operations that are responsive to the a selected UBER of that page type and a selected code rate of that page type.

Different UBERs associated with different (responsive) voltage level distributions can be estimated, calculated, and measured, step 1240.

Step 1240 can include programming multiple pages of the flash memory in different manners to provide at least one group of UBERs.

Step 1240 may include programming an MSB page by utilizing a programming operation that facilitates non-uniform voltage level distribution in which lobes are not equally spaced from each other.

Either one of the mentioned above methods can be executed by a computer readable medium that may be a non-transient computer readable medium such as a disk, diskette, type, and the like.

Thus, while there have been shown, described, and pointed out fundamental novel features of the invention as applied to several embodiments, it will be understood that various omissions, substitutions, and changes in the form and details may be made by those skilled in the art without departing from the spirit and scope of the invention. Substitutions of elements from one embodiment to another are also fully intended and contemplated. It is also to be understood that the drawings are not necessarily drawn to scale, but that they are merely conceptual in nature. The invention is defined solely with regard to the claims appended hereto, and equivalents of the recitations therein.

We claim:

1. A method for programming a flash memory having two bits per cell flash memory cells, the method comprising:
    providing multiple pairs of most significant bit (MSB) page uncoded bit error rates (UBERs) and least significant bit (LSB) page UBERs, each pair of said multiple pairs for a respective plurality of two bits per cell flash memory cells; wherein an average UBER of each pair of said multiple pairs is an average of an MSB page UBER of the pair and a LSB page UBER of the pair;
    associating each MSB page with an MSB of the two bits;
    associating each LSB page with an LSB of the two bits;
        selecting a highest pair of said multiple pairs, wherein the average UBER of the highest pair is highest of the average UBER of each pair of said multiple pairs, wherein the MSB page UBER of the highest pair is a selected MSB page UBER, and the LSB page UBER of the highest pair is a selected LSB page UBER;
        determining a selected MSB page code rate and a selected LSB page code rate, wherein the selected MSB page code rate is associated with the selected MSB page UBER, and the selected LSB page code rate is associated with the selected LSB page UBER, wherein the selected MSB page code rate and the selected LSB page code rate are obtained under a desired code rate constraint; and
    determining an encoding and programming scheme based on the selected MSB page UBER, the selected MSB page code rate, the selected LSB page UBER, and the selected LSB page code rate.

2. The method of claim 1, further including the steps of: encoding information and storing the encoded information in a MSB page by applying encoding and programming operations that are responsive to the selected MSB page UBER and to the selected MSB page code rate; and encoding information and storing the encoded information in a LSB page by applying encoding and programming operations that are responsive to the selected LSB page UBER and to the selected LSB page code rate.

3. The method of claim 1, further including the step of programming multiple pages of the flash memory in different manners to provide the multiple pairs of MSB page UBERs and LSB page UBERs.

4. The method of claim 1, further including the steps of: calculating a relationship between UBER values and code rate values for a desired code rate range; and selecting the selected MSB page code rate, the selected LSB page code rate, the selected MSB page UBER, and the selected LSB page UBER such as to comply with the relationship.

5. The method of claim 1, further including the step of programming multiple cells of the flash memory by utilizing a programming operation that facilitates non-uniform voltage level distribution.

6. The method of claim 5, further including the step of programming the flash memory to obtain equal UBER for each of the multiple pairs.

7. The method of claim 1, further including the step of programming the flash memory to obtain equal UBER for each of the multiple pairs.

8. The method of claim 1, further including the step of estimating voltage level distributions that achieve the multiple pairs of MSB page UBERs and LSB page UBERs.

9. The method of claim 8 wherein the estimating step further includes the step of applying a statistical retention model.

10. The method of claim 8, further including the step of applying an accelerated retention test at a temperature greater than 55.degree. C.

11. The method of claim 1, further including the steps of: measuring UBERs of different voltage level distributions; and selecting voltage level distributions that support the multiple pairs of MSB page UBERs and LSB page UBERs.

12. The method of claim 11, further including the step of programming the flash memory to support the highest average UBER.

13. A system for programming a flash memory, the system comprising:
a flash memory unit having two bits per cell flash memory cells;
an uncoded bit error rate generator unit configured to provide multiple pairs of most significant bit (MSB) page uncoded bit error rates (UBERs) and least significant bit (LSB) page UBERs; wherein an average UBER of each pair of said multiple pairs is an average of (a) an MSB page UBER of the pair and (b) a LSB page UBER of the pair; wherein each MSB page is associated with a MSB of the two bits; and wherein each LSB page is associated with a LSB of the two bits;
a selector unit configured to select a highest pair of said multiple pairs, wherein the average UBER of the highest pair is highest of the average UBER of each pair of said multiple pairs, wherein the MSB page UBER of the highest pair is a selected MSB page UBER, and the LSB page UBER of the highest pair is a selected LSB page UBER; and determine a selected MSB page code rate and a selected LSB page code rate, wherein the selected MSB page code rate is associated with the selected MSB page UBER, and the selected LSB page code rate is associated with the selected LSB page UBER, wherein the selected MSB page code rate and the selected LSB page code rate are obtained under a desired code rate constraint;
a programming scheme determination module configured to determine an encoding and programming scheme that is based on the selected MSB page code rate and the selected LSB page code rate; and
a controller configured to use the selected MSB page code rate and the selected LSB page code rate and a determined encoding and programming scheme for a range of program/erase cycles and for all or a subset of the two bits per cell flash memory cells.

14. The system of claim 13, further comprising: an encoder unit configured to encode information by applying encoding operations that are responsive to either one of the selected MSB page code rate and the selected LSB page code rate; and a programming circuit configured to program encoded information to a LSB page by applying programming operations responsive to the selected LSB page UBER, and further configured to encode information to a MSB page by applying programming operations that are responsive to the selected MSB page UBER.

15. The system of claim 13, further comprising a programming circuit configured to program multiple pages of the flash memory in different manners to provide the multiple pairs.

16. The system of claim 13, wherein the uncoded bit error rate generator unit is configured to calculate a relationship between UBER values and code rate values for a desired code rate range; and wherein the selector unit is configured to select the selected MSB page code rate, the selected LSB page code rate, the selected MSB page UBER and the selected LSB page UBER such as to comply with the relationship.

17. The system of claim 13, further comprising a programming circuit configured to program an MSB page by utilizing a programming operation that facilitates non-uniform voltage level distribution.

18. The system of claim 13, further comprising a voltage level distribution module configured to estimate voltage level distributions that achieve the multiple pairs.

19. The system of claim 18, wherein the voltage level distribution module is further configured to estimate the voltage level distributions by applying a statistical retention model.

20. The system of claim 18, further including a voltage level distribution module configured to estimate at least one voltage level distribution by applying an accelerated retention test at a temperature that is greater than 55.degree. C.

21. The system of claim 13, further comprising a voltage level distribution module configured to measure UBERs of different voltage level distributions and select voltage level distributions that achieve the multiple pairs, under a coding rate constraint.

22. A method for programming a flash memory having multiple bits per cell flash memory cells, the method comprising the steps of:
providing multiple groups of uncoded bit error rates (UBERs), wherein each group of UBERs of said multiple groups of UBERs comprises UBERs for a plurality of page types, and wherein each page type of the plurality of page types is associated with a different bit of the multiple bits; wherein each group of UBERs has an average UBER that equals an average of all UBERs of the group of UBERs;
selecting a highest group of said multiple groups, wherein an average UBER of the highest group is highest of the average UBER of each group of said multiple groups, wherein each page of the highest group of each type of page of the plurality of page types is a selected page type UBER;
determining a selected group of code rates that are associated with selected page type UBERs, wherein the selected group of code rates are obtained under a desired code rate constraint;
determining an encoding and programming scheme based on the selected group of code rates; and
configuring a controller to use the selected group of code rates and the encoding and programming scheme for a range of program/erase cycles and for all or a subset of the multiple bits per cell memory cells.

23. The method of claim 22 wherein each group of UBERs of said multiple groups of UBERs comprises
most significant bit (MSB) page UBERs and least significant bit (LSB) page UBERs.

24. The method of claim 22, further including the steps of encoding information and storing the encoded information in each page type by applying encoding and programming operations responsive to a selected UBER of that page type and a selected code rate of that page type.

25. The method of claim 22, further including the step of programming multiple pages of the flash memory in different manners to provide at least one group of UBERs.

26. The method of claim 22, further including the steps of: calculating a relationship between UBER values and code rate values for a desired code rate range; and selecting the selected group of code rates such as to comply with the relationship.

27. The method of claim 22, further including the step of programming multiple cells of the flash memory by utilizing a programming operation that facilitates non-uniform voltage level distribution.

28. The method of claim 27, further including the step of programming the flash memory to obtain equal UBER for each of the page types.

29. The method of claim 22, further including the step of programming the flash memory to obtain equal UBER for each of the page types.

30. The method of claim 22, further including the step of estimating voltage level distributions that achieve the multiple groups of UBERs.

31. The method of claim 30, wherein the estimating step includes applying a statistical retention model.

32. The method of claim 30, further including the step of applying an accelerated retention test at high temperature.

33. The method of claim 22, further including the steps of: measuring UBERs of different voltage level distributions; and selecting voltage level distributions that support the multiple groups of UBERs.

34. The method of claim 22, further including the step of programming the flash memory to support the highest average UBER.

35. A system for programming a flash memory, the system comprises:
   a flash memory unit having multiple bits per cell memory cells;
   an uncoded bit error rate generator unit configured to provide multiple groups of uncoded bit error rates (UBERs), wherein each group of UBERs of said multiple groups of UBERs comprises UBERs for a plurality of page types, and each page type of the plurality of page types is associated with a different bit of the multiple bits; wherein each group of UBERs has an average UBER that equals an average of all UBERs of the group of UBERs;
   a selector unit configured to select a highest group of said multiple groups, wherein the average UBER of the highest group is highest of the average UBER of each group of said multiple groups, wherein each page of the highest group of each type of page of the plurality of page types is a selected page type UBER; and determine a selected group of code rates that are associated with selected page type UBERs, wherein the selected group of code rates are obtained under a desired code rate constraint;
   a programming scheme determination module configured to determine an encoding and programming scheme that is based on the selected group of code rates; and
   a controller configured to use the selected group of code rates and the encoding and programming scheme for a range of program/erase cycles and for all or a subset of the multiple bits per cell memory cells.

36. The system of claim 35, further comprising an encoder unit configured to encode information and store the encoded information in each page type by applying encoding and programming operations responsive to a selected UBER of that page type and a selected code rate of that page type.

37. The system of claim 35, further comprising a programming circuit configured to program multiple pages of the flash memory in different manners to provide at least one group of UBERs.

38. The system of claim 35, wherein the uncoded bit error rate generator unit is further configured to calculate a relationship between UBER values and code rate values for a desired code rate range; and the selector unit is further configured to select a group of code rates such as to comply with the relationship.

39. The system of claim 35, further comprising a programming circuit configured to program the flash memory to obtain equal UBER for each of the page types.

40. The system of claim 35, further comprising a programming circuit configured to program the flash memory to obtain equal UBER for each of the page types.

41. The system of claim 35, further comprising a voltage level distribution module configured to estimate voltage level distributions that achieve the multiple groups of UBERs.

42. The system of claim 41 wherein the voltage level distribution module is configured to estimate voltage level distributions by applying a statistical retention model.

43. The system of claim 41, wherein the voltage level distribution module is configured to estimate at least one voltage level distribution by applying an accelerated retention test at a temperature that is greater than 55.degree. C.

44. The system of claim 35, further including a voltage level distribution module configured to measure UBERs of different voltage level distributions and select voltage level distributions that support the multiple groups of UBERs.

45. The system of claim 35, further comprising a programming circuit configured to program the flash memory to support the highest average UBER.

46. A non-transitory computer readable medium embedding an executable computer program code configured to instruct a system to program a flash memory having two bits per cell flash memory cells, the executable computer program code comprising the steps of: providing multiple pairs of most significant bit (MSB) page uncoded bit error rates (UBERs) and least significant bit (LSB) page UBERs; wherein each MSB page is associated with a MSB of the two bits and wherein each LSB page is associated with a LSB of the two bits; wherein an average UBER of each pair of the multiple pairs of MSB page UBERs and LSB page UBERs is an average of an MSB page UBER of the pair and a LSB page UBER of the pair;
   selecting a highest pair of said multiple pairs, wherein the average UBER of the highest pair is highest of the average UBER of each pair of said multiple pairs, wherein the MSB page UBER of the highest pair is a selected MSB page UBER, and the LSB page UBER of the highest pair is a selected LSB page UBER;
   determining a selected MSB page code rate and a selected LSB page code rate, wherein the selected MSB page code rate is associated with the selected MSB page UBER, and the selected LSB page code rate is associated with the selected LSB page UBER, wherein the selected MSB page code rate and the selected LSB page code rate are obtained under a desired code rate constraint; and determining an encoding and programming scheme that is based on the selected MSB code rate and the selected LSB code rate.

47. The non-transitory computer readable medium of claim 46, wherein the executable computer program code further comprising instructions for: encoding information and storing the encoded information in a MSB page by applying encoding and programming operations that are responsive to the selected MSB page UBER and to the selected MSB page code rate; and encoding information and storing the encoded information in a LSB page by applying encoding and programming operations that are responsive to the selected LSB page UBER and to the selected LSB page code rate.

48. The non-transitory computer readable medium of claim 46, wherein the executable computer program code further comprising instructions for programming multiple pages of the flash memory in different manners to provide the multiple pairs.

49. The non-transitory computer readable medium of claim 46, wherein the executable computer program code further comprising instructions for: calculating a relationship between UBER values and code rate values for a desired code rate range; and selecting the selected MSB page code rate, the selected LSB page code rate, the selected MSB page UBER and the selected LSB page UBER such as to comply with the relationship.

50. The non-transitory computer readable medium of claim 46, wherein the executable computer program code further comprising instructions for programming multiple cells of the flash memory by utilizing a programming operation that facilitates non-uniform voltage level distribution.

51. The non-transitory computer readable medium of claim 50, wherein the executable computer program code further comprising instructions for programming the flash memory to obtain equal UBER for each of the multiple pairs.

52. The non-transitory computer readable medium of claim 46, wherein the executable computer program code further comprising instructions for programming the flash memory to obtain equal UBER for each of the multiple pairs.

53. The non-transitory computer readable medium of claim 46, wherein the executable computer code further comprising instructions for estimating voltage level distributions that achieve the multiple pairs of MSB page UBERs and LSB page UBERs.

54. The non-transitory computer readable medium of claim 53, wherein the executable computer program code further comprising instructions for applying a statistical retention model.

55. The non-transitory computer readable medium of claim 46, wherein the executable computer program code further comprising instructions for measuring UBERs of different voltage level distributions and selecting voltage level distributions that support the multiple pairs of MSB page UBERs and LSB page UBERs.

56. The non-transitory computer readable medium of claim 55, wherein the executable computer program code comprising instructions for programming the flash memory to support a highest average UBER.

57. A non-transitory computer readable medium embedding an executable computer program code configured to instruct a system to program a flash memory, the executable computer program code comprising the steps of:
   providing multiple groups of uncoded bit error rates (UBERs), wherein each group of UBERs of the multiple groups of UBERs comprises UBERs for a plurality of page types; wherein each page type of the plurality of page types is associated with a different bit of the multiple bits; wherein each group of UBERs has an average UBER that equals an average UBER of all UBERs of the group of UBERs;
   selecting a highest group of said multiple groups, wherein an average UBER of the highest group is highest of the average UBER of each group of said multiple groups, wherein each page of the highest group of each type of page of the plurality of page types is a selected page type UBER;
   determining a selected group of code rates that are associated with selected page type UBERs, wherein the selected group of code rates are obtained under a desired code rate constraint; and
   determining an encoding and programming scheme that is based on the selected group of UBERs.

58. The non-transitory computer readable medium of claim 57, wherein each group of UBERs of the multiple groups of UBERs comprises most significant bit (MSB) page UBERs and least significant bit (LSB) page UBERs.

59. The non-transitory computer readable medium of claim 57, wherein the executable computer code further comprising instructions for encoding information and storing the encoded information in each page type by applying encoding and programming operations responsive to a selected UBER of that page type and a selected code rate of that page type.

60. The non-transitory computer readable medium of claim 57, wherein the executable computer code further comprising instructions for programming multiple pages of the flash memory in different manners to provide at least one group of UBERs.

61. The non-transitory computer readable medium of claim 57, wherein the executable computer code further comprising instructions for: calculating a relationship between UBER values and code rate values for the desired code rate range constraint; and selecting the selected group of code rates such as to comply with the relationship.

62. The non-transitory computer readable medium of claim 57, wherein the executable computer code further comprising instructions for programming multiple cells of the flash memory by utilizing a programming operation that facilitates non-uniform voltage level distribution.

63. The non-transitory computer readable medium of claim 57, wherein the executable computer code further comprising instructions for programming the flash memory to obtain equal UBER for each of the page types.

64. The non-transitory computer readable medium of claim 57, wherein the executable computer code further comprising instructions for estimating voltage level distributions that achieve the multiple groups of UBERs.

65. The non-transitory computer readable medium of claim 57, wherein the executable computer code further comprising instructions for applying a statistical retention model.

66. The non-transitory computer readable medium of claim 57, wherein the executable computer code further comprising instructions for measuring UBERs of different voltage level distributions and selecting voltage level distributions that support the multiple groups of UBERs.

67. The non-transitory computer readable medium of claim 57, wherein the executable computer code further comprising instructions for programming the flash memory to support the highest average UBER.

* * * * *